US011977110B2

(12) United States Patent
Guo et al.

(10) Patent No.: US 11,977,110 B2
(45) Date of Patent: May 7, 2024

(54) CONVERTER SYSTEM, METHOD AND APPARATUS FOR DETECTING INSULATION RESISTANCE OF SYSTEM, AND MEDIUM

(71) Applicant: Huawei Digital Power Technologies Co., Ltd., Shenzhen (CN)

(72) Inventors: Haibin Guo, Shanghai (CN); Huan Zhao, Shanghai (CN); Zhiwu Xu, Shanghai (CN); Lin Li, Shanghai (CN)

(73) Assignee: HUAWEI DIGITAL POWER TECHNOLOGIES CO., LTD., Shenzhen (CN)

( * ) Notice: Subject to any disclaimer, the term of this patent is extended or adjusted under 35 U.S.C. 154(b) by 148 days.

(21) Appl. No.: 17/667,297

(22) Filed: Feb. 8, 2022

(65) Prior Publication Data

US 2022/0252657 A1    Aug. 11, 2022

(30) Foreign Application Priority Data

Feb. 9, 2021    (CN) .......................... 202110181665.7

(51) Int. Cl.
*G01R 31/14*    (2006.01)
*H02M 1/00*    (2006.01)

(52) U.S. Cl.
CPC .......... *G01R 31/14* (2013.01); *H02M 1/0003* (2021.05)

(58) Field of Classification Search
CPC ........ G01R 31/52; G01R 31/12; G01R 31/14; G01R 31/50; G01R 27/025; G01R 27/08;
(Continued)

(56) References Cited

U.S. PATENT DOCUMENTS 9,678,028 B2*   6/2017  Eyssler ............... G01R 31/389
11,243,259 B2*  2/2022  Tong .................... G01R 31/385
(Continued)

FOREIGN PATENT DOCUMENTS

BR    102019021974 A2 *  4/2021
CN       101917047 A  * 12/2010
(Continued)

OTHER PUBLICATIONS

CN 104378068 A—provided English translation (Year: 2015).*
(Continued)

*Primary Examiner* — Jermele M Hollington
(74) *Attorney, Agent, or Firm* — WOMBLE BOND DICKINSON (US) LLP

(57) ABSTRACT

A converter system includes a plurality of converters, a sampling circuit, and a control circuit. The plurality of converters are connected in parallel. Each converter includes a detection circuit which includes a first switch and at least two resistors. The first switch is connected in parallel with one of the at least two resistors. The control circuit control the sampling circuit to collect a first voltage and a second voltage, where the first voltage is a voltage that is between a second bus and a ground cable and that is collected by the sampling circuit when first switches in detection circuits of a first quantity are in a turn-on state, the second voltage is a voltage that is between the second bus and the ground cable and that is collected by the sampling circuit when first switches in detection circuits of a second quantity are in a turn-on state.

20 Claims, 17 Drawing Sheets

(58) Field of Classification Search
CPC .. G01R 27/18; H02M 1/0003; H02M 1/0009; H02M 1/0067; H02M 1/0045; H02M 1/008; H02M 3/285; H02M 7/77; H02J 1/10
USPC .......................................................... 324/551
See application file for complete search history.

(56) References Cited

U.S. PATENT DOCUMENTS

| | | | |
|---|---|---|---|
| 11,515,795 B2 * | 11/2022 | Li | H02M 3/155 |
| 11,852,671 B2 * | 12/2023 | Wang | G01R 31/14 |
| 2016/0216220 A1 * | 7/2016 | Eyssler | G01N 27/416 |
| 2016/0261205 A1 * | 9/2016 | Kolar | H02M 1/32 |
| 2020/0064410 A1 * | 2/2020 | Tong | G01R 31/389 |
| 2020/0091704 A1 * | 3/2020 | Huang | H02M 1/32 |
| 2021/0044208 A1 * | 2/2021 | Li | H02J 7/02 |
| 2022/0115960 A1 * | 4/2022 | Huang | H02J 7/02 |
| 2022/0252657 A1 * | 8/2022 | Guo | G01R 27/20 |
| 2022/0252680 A1 * | 8/2022 | Su | G01R 27/02 |
| 2022/0326294 A1 * | 10/2022 | Wang | H02S 50/10 |
| 2023/0037399 A1 * | 2/2023 | Li | H02M 1/009 |
| 2023/0137732 A1 * | 5/2023 | Huang | H02M 1/0074 307/82 |

FOREIGN PATENT DOCUMENTS

| | | | | |
|---|---|---|---|---|
| CN | 104378068 A | * | 2/2015 | ............ G01R 27/18 |
| CN | 105356848 A | | 2/2016 | |
| CN | 105356848 A | * | 2/2016 | |
| CN | 107643449 A | * | 1/2018 | |
| CN | 106452358 B | * | 7/2018 | ........... G01R 27/025 |
| CN | 207601183 U | * | 7/2018 | |
| CN | 108146297 B | * | 5/2020 | .............. B60M 3/00 |
| CN | 111669052 A | * | 9/2020 | ................ B60L 1/00 |
| CN | 111682762 A | * | 9/2020 | ....... G01R 19/16576 |
| CN | 212031650 U | * | 11/2020 | |
| CN | 113252980 A | * | 8/2021 | ........... G01R 27/025 |
| CN | 214150858 U | * | 9/2021 | |
| CN | 114362335 A | * | 4/2022 | |
| CN | 114910699 A | * | 8/2022 | ............. G01R 31/14 |
| CN | 115580220 A | * | 1/2023 | |
| CN | 115580220 B | * | 3/2023 | |
| CN | 218727766 U | * | 3/2023 | |
| DE | 102021116418 A1 | * | 12/2022 | |
| EP | 3985849 A1 | * | 4/2022 | |
| EP | 3988948 A1 | * | 4/2022 | ............. G01R 27/02 |
| JP | 2021050963 A | * | 4/2021 | |
| JP | 2021099226 A | * | 7/2021 | |
| WO | WO-2013040979 A1 | * | 3/2013 | ............. G01R 31/02 |
| WO | WO-2021043173 A1 | * | 3/2021 | ............. G01R 27/02 |
| WO | WO-2021199490 A1 | * | 10/2021 | |
| WO | WO-2022198659 A1 | * | 9/2022 | |

OTHER PUBLICATIONS

CN 212031650 U—provided English translation (Year: 2020).*
CN 111682762 A—provided English translation (Year: 2020).*
Translation of CN 113252980 A (Year: 2021).*

* cited by examiner

CONVERTER SYSTEM, METHOD AND APPARATUS FOR DETECTING INSULATION RESISTANCE OF SYSTEM, AND MEDIUM

CROSS-REFERENCE TO RELATED APPLICATION

This application claims priority to Chinese Patent Application No. 202110181665.7, filed on Feb. 9, 2021, which is hereby incorporated by reference in its entirety.

TECHNICAL FIELD

This application relates to the field of electronic technologies, and in particular, to a converter system, a method and an apparatus of detecting an insulation resistance of a system, and a medium.

BACKGROUND

In an application scenario of a converter, a ground insulation resistance of the converter on a direct current side may represent insulation performance of a direct current system. If the ground insulation resistance of the converter on the direct current side is excessively low, current leakage may occur in the converter. This poses a threat to a person. Therefore, an insulation resistance detection capability of the converter has become a basic requirement in a safety standard. Generally, an insulation detection circuit is disposed in the converter, and is configured to detect a ground insulation resistance existing when the converter is independently connected between a positive bus and a negative bus.

In a system in which a plurality of converters are connected in parallel, because the plurality of converters are connected in parallel, a ground insulation resistance of the system is very small. In some embodiments, a larger quantity of converters connected in parallel indicates a smaller ground insulation resistance of the system. As a result, it is more difficult for an insulation detection circuit disposed in a single converter to meet a high-precision detection requirement of the ground insulation resistance of the system.

SUMMARY

This application provides a converter system, a method and an apparatus for detecting an insulation resistance of a system, and a medium, to improve detection precision of the insulation resistance of the system without increasing system costs.

An embodiment (sometimes referred to as, "a first aspect") of this application provides a converter system, including a plurality of converters, a sampling circuit, and a control circuit. The plurality of converters are connected in parallel between a first bus and a second bus. The sampling circuit is connected between the second bus and a ground cable. The control circuit is connected to each converter. The control circuit is further connected to the sampling circuit. Each converter includes a detection circuit. The detection circuit includes a first switch and at least two resistors connected in series between the second bus and the ground cable. The first switch is connected in parallel with one of the at least two resistors. The first switch is controlled by the control circuit. The sampling circuit is configured to collect a voltage between the second bus and the ground cable. The control circuit is configured to: control the sampling circuit to collect a first voltage and a second voltage, where the first voltage is a voltage that is between the second bus and the ground cable and that is collected by the sampling circuit when first switches in detection circuits of a first quantity are in a turn-on state, the second voltage is a voltage that is between the second bus and the ground cable and that is collected by the sampling circuit when first switches in detection circuits of a second quantity are in a turn-on state, and the second quantity is different from the first quantity; and/or determine a ground insulation resistance of the converter system based on the first voltage and the second voltage.

According to the foregoing system structure, the control circuit determines the ground insulation resistance of the converter system by using voltages that are between the second bus and the ground cable and that exist when switches in detection circuits of different quantities are in a turn-on state, and there is no need to additionally add another component. The detection circuits are connected in parallel. Therefore, equivalent detection resistances that are between the second bus and the ground cable in the converter system and that exist when the switches in the detection circuits of different quantities are in a turn-on state are less than a detection resistance in a detection circuit of a single converter. This can reduce a maximum sampling deviation existing when the sampling circuit obtains a voltage, and improve detection precision of the ground resistance of the system.

In some embodiments, the detection circuit specifically includes two resistors connected in series between the second bus and the ground cable, and the first switch is connected in parallel with a first resistor in the two resistors; and the ground insulation resistance that is of the converter system and that is determined by the control circuit based on the first voltage and the second voltage meets the following formula:

$$Riso = \frac{Rz1 \times Rz2}{Rz1 + Rz2}$$

where Riso is the ground insulation resistance of the converter, Rz2 is an insulation resistance between the second bus and the ground cable, Rz1 is an insulation resistance between the first bus and the ground cable, $$Rz2 = \frac{Rd1 \times Rd2 - \frac{VB-V2}{VB-V1} \times \frac{V1}{V2} \times Rd1 \times Rd2}{\frac{VB-V2}{VB-V1} \times \frac{V1}{V2} \times Rd2 - Rd1},$$

$$Rz1 = \frac{VB-V1}{V1} \times \frac{Rz2 Rd1}{Rz2 + Rd1},$$

Rd1 is an equivalent detection resistance that is between the second bus and the ground cable and that exists when the first switches in the detection circuits of the first quantity are in a turn-on state, Rd2 is an equivalent detection resistance that is between the second bus and the ground cable and that exists when the first switches in the detection circuits of the second quantity are in a turn-on state, $$Rd1 = \frac{RA \times (RA + RB)}{nRA + iRB}, Rd2 = \frac{RA \times (RA + RB)}{nRA + jRB},$$

i is the first quantity, i ∈ [0, n], j is the second quantity, j ∈ [0, n], i≠j, RB is a resistance value of the first resistor, RA is a resistance value of a second resistor other than the first resistor in the two resistors, n is a quantity of the plurality of converters, VB is a voltage between the first bus and the second bus, V1 is the first voltage, and V2 is the second voltage.

According to the foregoing system structure, each detection circuit includes a first resistor and a second resistor that are connected in series between the second bus and the ground cable. The control circuit may determine the ground insulation resistance of the converter system based on a relationship among the first resistor, the second resistor, the first voltage, the second voltage, the quantity of the plurality of converters, the first quantity, and the second quantity.

In some embodiments, the detection circuit further includes at least one resistor connected between the first bus and the ground cable.

According to the foregoing system structure, the detection circuits are connected in parallel. Therefore, equivalent detection resistances that are between the first bus and the ground cable in the converter system and that exist when the switches in the detection circuits of different quantities are in a turn-on state are less than a detection resistance in a detection circuit of a single converter. This can reduce a maximum sampling deviation existing when the sampling circuit obtains a voltage, and improve detection precision of the ground resistance of the system.

In some embodiments, the detection circuit further includes a third resistor connected between the first bus and the ground cable; and the ground insulation resistance that is of the converter system and that is determined by the control circuit based on the first voltage and the second voltage meets the following formula:

$$Riso = \frac{Rz1 \times Rz2}{Rz1 + Rz2}$$

where Riso is the ground insulation resistance of the converter, Rz2 is the insulation resistance between the second bus and the ground cable, Rz1 is the insulation resistance between the first bus and the ground cable, $$Rz2 = \frac{Rd1 \times Rd2 - \frac{VB-V2}{VB-V1} \times \frac{V1}{V2} \times Rd1 \times Rd2}{\frac{VB-V2}{VB-V1} \times \frac{V1}{V2} \times Rd2 - Rd1},$$

$$Rz1 = \frac{\frac{VB-V1}{V1} \times \frac{Rz2 Rd1}{Rz2+Rd1}}{RC - n \times \frac{VB-V1}{V1} \times \frac{Rz2 Rd1}{Rz2+Rd1}},$$

Rd1 is the equivalent detection resistance that is between the second bus and the ground cable and that exists when the first switches in the detection circuits of the first quantity are in a turn-on state, Rd2 is the equivalent detection resistance that is between the second bus and the ground cable and that exists when the first switches in the detection circuits of the second quantity are in a turn-on state, $$Rd1 = \frac{RA \times (RA + RB)}{nRA + iRB}, Rd2 = \frac{RA \times (RA + RB)}{nRA + jRB},$$

i is the first quantity, i ∈ [0, n], j is the second quantity, j ∈ [0, n], i≠j, RB is the resistance value of the first resistor, RA is the resistance value of the second resistor other than the first resistor in the two resistors, n is the quantity of the plurality of converters, RC is a resistance value of the third resistor, VB is the voltage between the first bus and the second bus, V1 is the first voltage, and V2 is the second voltage.

According to the foregoing system structure, each detection circuit includes a first resistor and a second resistor that are connected in series between the second bus and the ground cable, and a third resistor connected between the first bus and the ground cable. The control circuit may determine the ground insulation resistance of the converter system based on a relationship among the first resistor, the second resistor, the third resistor, the first voltage, the second voltage, the quantity of the plurality of converters, the first quantity, and the second quantity.

In some embodiments, the detection circuit further includes a second switch and at least two resistors connected in series between the first bus and the ground cable, the second switch is connected in parallel with one of the at least two resistors connected in series between the first bus and the ground cable, and the second switch is controlled by the control circuit.

In some embodiments, the detection circuit specifically includes two resistors connected in series between the second bus and the ground cable, and the first switch is connected in parallel with a first resistor in the two resistors; the detection circuit further includes a second switch and two resistors connected in series between the first bus and the ground cable, and the second switch is connected in parallel with a fourth resistor in the two resistors connected in series between the first bus and the ground cable; and if a first switch in each detection circuit is in a turn-on state, a second switch in the detection circuit is in a turn-off state; or if a first switch in each detection circuit is in a turn-off state, a second switch in the detection circuit is in a turn-on state.

In some embodiments, the first quantity is zero, the second quantity is a quantity of the plurality of converters, a resistance value of the fourth resistor is the same as a resistance value of the first resistor, and a resistance value of a fifth resistor other than the fourth circuit in the two resistors connected in series between the first bus and the ground cable is the same as the resistance value of the first resistor; and/or the ground insulation resistance that is of the converter system and that is determined by the control circuit based on the first voltage and the second voltage meets the following formula:

$$Riso = \frac{1}{\frac{\frac{VB}{V1-V2}-1}{\frac{RA}{n}} + \frac{\frac{VB}{V1-V2}+1}{\frac{RA+RB}{n}}}$$

where Riso is the ground insulation resistance of the converter, RB is the resistance value of the first resistor, RA is a resistance value of a second resistor other than the first resistor in the two resistors connected in series between the second bus and the ground cable, n is the quantity of the plurality of converters, VB is a voltage between the first bus and the second bus, V1 is the first voltage, and V2 is the second voltage.

In some embodiments, the control circuit includes a plurality of controllers, and the plurality of controllers are in a one-to-one correspondence with the plurality of converters; each controller is connected to a corresponding converter, and is configured to control a switch in a detection circuit of the corresponding converter; and the plurality of controllers include one or more primary controllers, the primary controller is configured to send an instruction to a controller other than the primary controller in the plurality of controllers, and/or the instruction is used to instruct the another controller to control a switch in a detection circuit of a corresponding converter.

In some embodiments, the control circuit includes a plurality of controllers, the plurality of controllers include a primary controller and a plurality of secondary controllers, and the plurality of secondary controllers are in a one-to-one correspondence with the plurality of converters; each secondary controller is connected to a corresponding converter, and is configured to control the corresponding converter; and the primary controller is configured to send an instruction to each secondary controller, and/or the instruction is used to instruct the secondary controller to control a switch in a detection circuit of the corresponding converter.

An embodiment (sometimes referred to as, "a second aspect") of this application provides a method of detecting an insulation resistance of a system, applied to a converter system. The converter system includes a plurality of converters and a sampling circuit. The plurality of converters are connected in parallel between a first bus and a second bus. The sampling circuit is connected between the second bus and a ground cable. Each converter includes a detection circuit. The detection circuit includes a first switch and at least two resistors connected in series between the second bus and the ground cable. The first switch is connected in parallel with one of the at least two resistors. The method includes: controlling (e.g., manipulating) the sampling circuit to collect a first voltage, where the first voltage is a voltage that is between the second bus and the ground cable and that exists when first switches in detection circuits of a first quantity are in a turn-on state; controlling the sampling circuit to collect a second voltage, where the second voltage is a voltage that is between the second bus and the ground cable and that exists when first switches in detection circuits of a second quantity are in a turn-on state, and the second quantity is different from the first quantity; and/or determining (e.g., calculating, measuring) a ground insulation resistance of the converter system based on the first voltage and the second voltage.

In some embodiments, the detection circuit specifically includes two resistors connected in series between the second bus and the ground cable, and the first switch is connected in parallel with a first resistor in the two resistors; and the ground insulation resistance that is of the converter system and that is determined based on the first voltage and the second voltage meets the following formula:

$$Riso = \frac{Rz1 \times Rz2}{Rz1 + Rz2}$$

where Riso is the ground insulation resistance of the converter, Rz2 is an insulation resistance between the second bus and the ground cable, Rz1 is an insulation resistance between the first bus and the ground cable, $$Rz2 = \frac{Rd1 \times Rd2 - \frac{VB-V2}{VB-V1} \times \frac{V1}{V2} \times Rd1 \times Rd2}{\frac{VB-V2}{VB-V1} \times \frac{V1}{V2} \times Rd2 - Rd1},$$

$$Rz1 = \frac{VB-V1}{V1} \times \frac{Rz2Rd1}{Rz2+Rd1},$$

Rd1 is an equivalent detection resistance that is between the second bus and the ground cable and that exists when the first switches in the detection circuits of the first quantity are in a turn-on state, Rd2 is an equivalent detection resistance that is between the second bus and the ground cable and that exists when the first switches in the detection circuits of the second quantity are in a turn-on state, $$Rd1 = \frac{RA \times (RA+RB)}{nRA+iRB}, Rd2 = \frac{RA \times (RA+RB)}{nRA+jRB},$$

i is the first quantity, i ∈ [0, n], j is the second quantity, j ∈ [0, n], RB is a resistance value of the first resistor, RA is a resistance value of a second resistor other than the first resistor in the two resistors, n is a quantity of the plurality of converters, VB is a voltage between the first bus and the second bus, V1 is the first voltage, and V2 is the second voltage.

In some embodiments, the detection circuit further includes at least one resistor connected between the first bus and the ground cable.

In some embodiments, the detection circuit further includes a third resistor connected between the first bus and the ground cable; and the ground insulation resistance that is of the converter system and that is determined based on the first voltage and the second voltage meets the following formula:

$$Riso = \frac{Rz1 \times Rz2}{Rz1 + Rz2}$$

where Riso is the ground insulation resistance of the converter, Rz2 is an insulation resistance between the second bus and the ground cable, Rz1 is an insulation resistance between the first bus and the ground cable, $$Rz2 = \frac{Rd1 \times Rd2 - \frac{VB-V2}{VB-V1} \times \frac{V1}{V2} \times Rd1 \times Rd2}{\frac{VB-V2}{VB-V1} \times \frac{V1}{V2} \times Rd2 - Rd1},$$

$$Rz1 = \frac{\frac{VB-V1}{V1} \times \frac{Rz2Rd1}{Rz2+Rd1}}{RC - n \times \frac{VB-V1}{V1} \times \frac{+Rz2Rd1}{Rz2+Rd1}},$$

Rd1 is an equivalent detection resistance that is between the second bus and the ground cable and that exists when the first switches in the detection circuits of the first quantity are in a turn-on state, Rd2 is an equivalent detection resistance that is between the second bus and the ground cable and that exists when the first switches in the detection circuits of the second quantity are in a turn-on state, $$Rd1 = \frac{RA \times (RA+RB)}{nRA+iRB}, Rd2 = \frac{RA \times (RA+RB)}{nRA+jRB},$$

i is the first quantity, i ∈ [0, n], j is the second quantity, j ∈ [0, n], RB is a resistance value of the first resistor, RA is a resistance value of a second resistor other than the first resistor in the two resistors, n is a quantity of the plurality of converters, RC is a resistance value of the third resistor, VB is a voltage between the first bus and the second bus, V1 is the first voltage, and V2 is the second voltage.

In some embodiments, the detection circuit further includes a second switch and at least two resistors connected in series between the first bus and the ground cable, and the second switch is connected in parallel with one of the at least two resistors connected in series between the first bus and the ground cable.

In some embodiments, the detection circuit specifically includes two resistors connected in series between the second bus and the ground cable, and the first switch is connected in parallel with a first resistor in the two resistors; the detection circuit further includes a second switch and two resistors connected in series between the first bus and the ground cable, and the second switch is connected in parallel with a fourth resistor in the two resistors connected in series between the first bus and the ground cable; and if a first switch in each detection circuit is in a turn-on state, a second switch in the detection circuit is in a turn-off state; or if a first switch in each detection circuit is in a turn-off state, a second switch in the detection circuit is in a turn-on state.

In some embodiments, the first quantity is zero, the second quantity is a quantity of the plurality of converters, a resistance value of the fourth resistor is the same as a resistance value of the first resistor, and a resistance value of a fifth resistor other than the fourth circuit in the two resistors connected in series between the first bus and the ground cable is the same as the resistance value of the first resistor; and the ground insulation resistance that is of the converter system and that is determined based on the first voltage and the second voltage meets the following formula:

the ground insulation resistance of the converter system is determined according to the following formula:

$$Riso = \cfrac{1}{\cfrac{\cfrac{VB}{V1-V2}-1}{RA} + \cfrac{\cfrac{VB}{V1-V2}+1}{RA+RB}}$$

where Riso is the ground insulation resistance of the converter, RB is the resistance value of the first resistor, and RA is a resistance value of a second resistor other than the first resistor in the two resistors connected in series between the second bus and the ground cable;

n is the quantity of the plurality of converters;

VB is a voltage between the first bus and the second bus; and

V1 is the first voltage, and V2 is the second voltage.

An embodiment (sometimes referred to as, "a third aspect") of this application provides a method of detecting an insulation resistance of a system, applied to a converter system. The converter system includes a plurality of converters, a sampling circuit, and a control circuit. The plurality of converters are connected in parallel between a first bus and a second bus. The sampling circuit is connected between the second bus and a ground cable. The control circuit is connected to each converter. The control circuit is connected to the sampling circuit. Each converter includes a detection circuit. The detection circuit includes a first switch and at least two resistors connected in series between the second bus and the ground cable. The first switch is connected in parallel with one of the at least two resistors. The control circuit includes a plurality of controllers. The plurality of controllers include a primary controller and a plurality of secondary controllers. One secondary controller corresponds to one converter. The method includes: The primary controller controls the sampling circuit to collect a first voltage between the second bus and the ground cable, where the first voltage is a voltage that is between the second bus and the ground cable and that exists when first switches in detection circuits of a first quantity are in a turn-on state. The primary controller controls the sampling circuit to collect a second voltage between the second bus and the ground cable, where the second voltage is a voltage that is between the second bus and the ground cable and that exists when first switches in detection circuits of a second quantity are in a turn-on state, and the second quantity is different from the first quantity. The primary controller determines a ground insulation resistance of the converter system based on a preset relationship among the resistors in the detection circuit, a quantity of the plurality of converters, the first quantity, the second quantity, the first voltage, and the second voltage.

In some embodiments, if the first quantity is not zero, before the primary controller controls the sampling circuit to collect the first voltage between the second bus and the ground cable, the method further includes: The primary controller sends a first switching instruction to secondary controllers of the first quantity, where the first switching instruction is used to instruct the secondary controller to control the first switch in the detection circuit to be in a turn-on state. That the primary controller controls the sampling circuit to collect a first voltage between the second bus and the ground cable includes: After first duration expires after the primary controller sends the first switching instruction to the secondary controllers of the first quantity, the primary controller controls the sampling circuit to collect the first voltage between the second bus and the ground cable.

In some embodiments, if the second quantity is not zero, after the primary controller controls the sampling circuit to collect the first voltage between the second bus and the ground cable, and before the primary controller controls the sampling circuit to collect the second voltage between the second bus and the ground cable, the method further includes: The primary controller sends a second switching instruction to secondary controllers of the second quantity, where the second switching instruction is used to instruct the secondary controller to control the first switch in the detection circuit to be in a turn-on state. That the primary controller controls the sampling circuit to collect a second voltage between the second bus and the ground cable includes: After second duration expires after the primary controller sends the second switching instruction to the secondary controllers of the second quantity, the primary controller controls the sampling circuit to collect the second voltage between the second bus and the ground cable.

In some embodiments, the detection circuit further includes a second switch and at least two resistors connected in series between the first bus and the ground cable, and the second switch is connected in parallel with one of the at least two resistors connected in series between the first bus and the ground cable.

In some embodiments, if the first quantity is zero, before the primary controller controls the sampling circuit to collect the first voltage between the second bus and the ground cable, the method further includes: The primary controller sends a third switching instruction to secondary controllers of the first quantity, where the third switching instruction is used to instruct the secondary controller to control the second switch in the detection circuit to be in a turn-on state. That the primary controller controls the sampling circuit to collect a first voltage between the second bus and the ground cable includes: After third duration expires after the primary controller sends the third switching instruction to the secondary controllers of the first quantity, the primary controller controls the sampling circuit to collect the first voltage between the second bus and the ground cable.

In some embodiments, if the second quantity is zero, after the primary controller controls the sampling circuit to collect the first voltage between the second bus and the ground cable, and before the primary controller controls the sampling circuit to collect the second voltage between the second bus and the ground cable, the method further includes: The primary controller sends a fourth switching instruction to secondary controllers of the second quantity, where the fourth switching instruction is used to instruct the secondary controller to control the second switch in the detection circuit to be in a turn-on state. That the primary controller controls the sampling circuit to collect a second voltage between the second bus and the ground cable includes: After fourth duration expires after the primary controller sends the fourth switching instruction to the secondary controllers of the second quantity, the primary controller controls the sampling circuit to collect the second voltage between the second bus and the ground cable.

In some embodiments, the plurality of secondary controllers are in a one-to-one correspondence with the plurality of converters.

In some embodiments, the primary controller corresponds to one converter. The method further includes: Before controlling the sampling circuit to collect the first voltage between the second bus and the ground cable, the primary controller controls a first switch in a detection circuit of the converter corresponding to the primary controller to be in a turn-on state. That the primary controller determines a ground insulation resistance of the converter system based on a preset relationship among the resistors in the detection circuit, a quantity of the plurality of converters, the first quantity, the second quantity, the first voltage, and the second voltage includes: The primary controller determines the ground insulation resistance of the converter system based on a preset relationship among the resistors in the detection circuit, the quantity of the plurality of converters, a third quantity, the second quantity, the first voltage, and the second voltage, where the third quantity is a sum of the first quantity and 1. In some embodiments, after controlling the sampling circuit to collect the first voltage between the second bus and the ground cable, and before controlling the sampling circuit to collect the second voltage between the second bus and the ground cable, the primary controller controls a first switch in a detection circuit of the converter corresponding to the primary controller to be in a turn-on state. That the primary controller determines a ground insulation resistance of the converter system based on a preset relationship among the resistors in the detection circuit, a quantity of the plurality of converters, the first quantity, the second quantity, the first voltage, and the second voltage includes: The primary controller determines the ground insulation resistance of the converter system based on a preset relationship among the resistors in the detection circuit, the quantity of the plurality of converters, the first quantity, a fourth quantity, the first voltage, and the second voltage, where the fourth quantity is a sum of the second quantity and 1.

In some embodiments, the first quantity is less than or equal to the quantity of the plurality of converters, and the second quantity is less than or equal to the quantity of the plurality of converters; or the first quantity is the quantity of the plurality of converters, and the second quantity is zero; or the second quantity is the quantity of the plurality of converters, and the first quantity is zero.

An embodiment (sometimes referred to as, "a fourth aspect") of this application provides a method of detecting an insulation resistance of a system, applied to a converter system. The converter system includes a plurality of converters, a sampling circuit, and a control circuit. The plurality of converters are connected in parallel between a first bus and a second bus. The sampling circuit is connected between the second bus and a ground cable. The control circuit is connected to each converter. The control circuit is connected to the sampling circuit. Each converter includes a detection circuit. The detection circuit includes a first switch and at least two resistors connected in series between the second bus and the ground cable. The first switch is connected in parallel with one of the at least two resistors. The control circuit includes a plurality of controllers. The plurality of controllers include a primary controller and a plurality of secondary controllers. One secondary controller corresponds to one converter. The method includes: The secondary controller receives a switching instruction sent by the primary controller; and if the switching instruction is a first switching instruction, the secondary controller controls a first switch in a detection circuit of a converter corresponding to the secondary controller to be in a turn-on state, where the first switching instruction is used to instruct the secondary controller to control the first switch to be in a turn-on state.

In some embodiments, the detection circuit further includes a second switch and at least two resistors connected in series between the first bus and the ground cable, the second switch is connected in parallel with one of the at least two resistors connected in series between the first bus and the ground cable, and the method further includes: If the switching instruction is a second switching instruction, the secondary controller controls a second switch in the detection circuit of the converter corresponding to the secondary controller to be in a turn-on state, where the second switching instruction is used to instruct the secondary controller to control the second switch to be in a turn-on state.

An embodiment (sometimes referred to as, "a fifth aspect") of this application provides an apparatus for detecting an insulation resistance of a system, used in a converter system. The converter system includes a plurality of converters. The plurality of converters are connected in parallel between a first bus and a second bus. Each converter includes a detection circuit. The detection circuit includes a first switch and at least two resistors connected in series between the second bus and a ground cable. The first switch is connected in parallel with one of the at least two resistors connected in series between the second bus and the ground cable. The apparatus includes: a collection unit, configured to obtain a first voltage and a second voltage, where the first voltage is a voltage that is between the second bus and the ground cable and that exists when first switches in detection circuits of a first quantity are in a turn-on state, the second voltage is a voltage that is between the second bus and the ground cable and that exists when first switches in detection circuits of a second quantity are in a turn-on state, and a second quantity is different from the first quantity; a memory, where the memory is configured to store a program, instructions, or code; and a processor, configured to execute the program, the instructions, or the code in the memory to complete the method in any one of the first aspect or the embodiments of the first aspect, any one of the second aspect or the embodiments of the second aspect, or any one of the third aspect or the embodiments of the third aspect.

According to a seventh aspect, an embodiment of this application provides a non-volatile computer-readable storage medium, configured to store a computer program, where the computer program is loaded by a processor to perform the method in any one of the first aspect or the embodiments of the first aspect, any one of the second aspect or the embodiments of the second aspect, or any one of the third aspect or the embodiments of the third aspect.

For technical effects that may be achieved in the second aspect and the seventh aspect, refer to descriptions of technical effects that may be achieved in a corresponding embodiment of the first aspect. Details are not described herein again.

DESCRIPTION OF EMBODIMENTS

Figure 1:
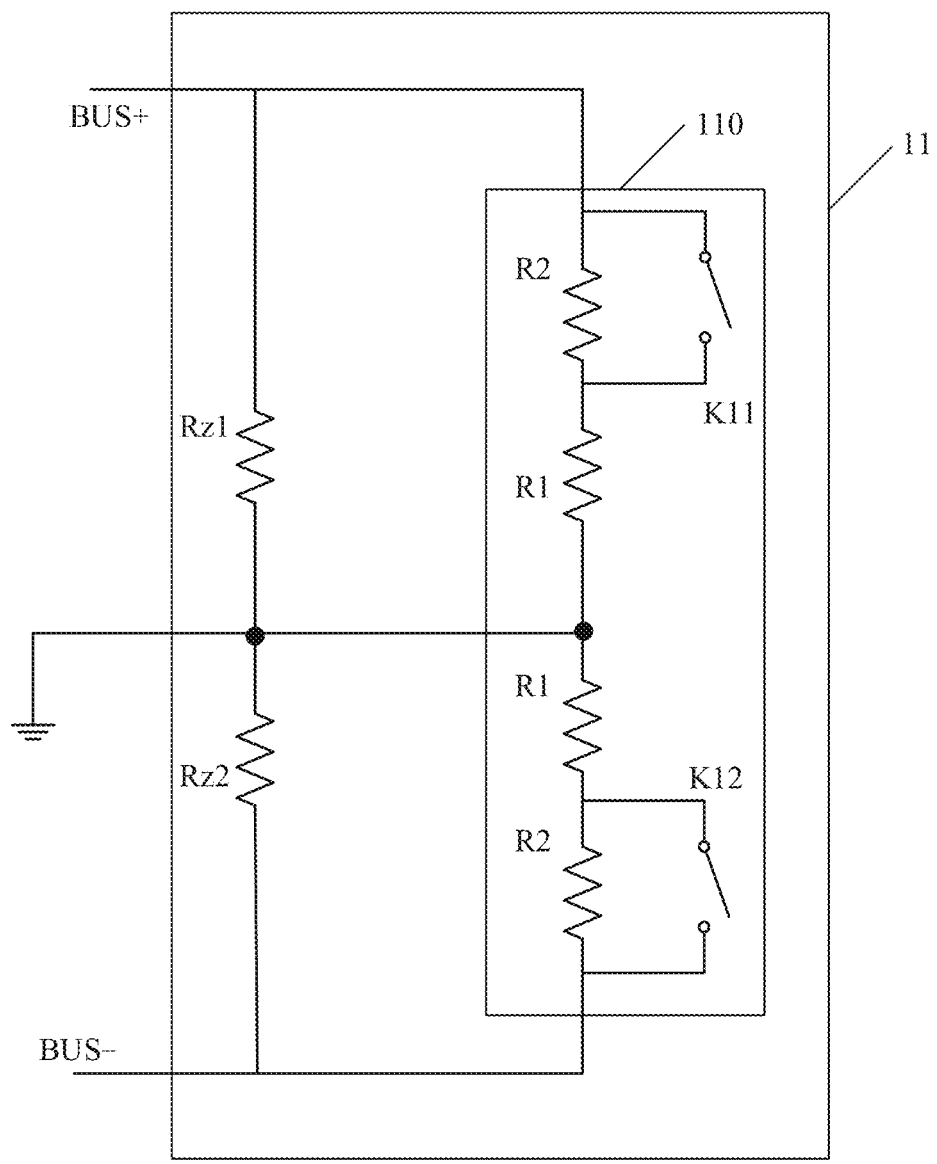
FIG. 1 is a schematic diagram of a structure of an insulation detection circuit of a single converter, according to some embodiments.

First, a process of detecting a ground insulation resistance of a single converter by using an insulation detection circuit is described. As shown in FIG. 1, a converter 11 is connected between a positive bus and a negative bus, and the converter 11 includes an insulation detection circuit 110. A ground insulation resistance of the converter 11 may be represented by using an equivalent resistance Rz1 and an equivalent resistance Rz2. The equivalent resistance Rz1 may be considered as a ground resistance between a ground terminal PE of the converter 11 and the positive electrode bus, and the equivalent resistance Rz2 may be considered as a ground resistance between the ground terminal PE of the converter 11 and the negative electrode bus. A resistance obtained after an equivalent resistor Rz1 and an equivalent resistor Rz2 are connected in parallel is the ground insulation resistance Riso of the converter 11.

The insulation detection circuit 110 may include a first resistor 111, a second resistor 112, a third resistor 113, and a fourth resistor 114 that are successively connected in series. Resistance values of the four resistors are respectively denoted as R1, R2, R1, and R2. The insulation detection circuit 110 further includes a first switch K11 and a second switch K12. The first switch K11 is connected in parallel with the second resistor 112, and the second switch K12 is connected in parallel with the fourth resistor 114. A connection point between the second resistor 112 and the third resistor 113 is connected to the ground terminal PE of the converter 11.

A process of performing insulation detection on the converter may fall into two control processes. A first control process is to control the first switch K11 to be in a turn-on state, control the second switch K12 to be in a turn-off state, and detect a voltage U1 between the ground terminal PE and the negative electrode bus. A second control process is to control the first switch K11 to be in a turn-off state, control the second switch K12 to be in a turn-on state, and detect a voltage U2 between the ground terminal PE and the negative electrode bus again.

In the first control process, in the insulation detection circuit 110, the first resistor 111 and the equivalent resistor Rz1 are connected in parallel, and the third resistor 113 and the fourth resistor 114 are connected in series and then connected in parallel with the equivalent resistor Rz2. A voltage between two terminals of the equivalent resistor Rz1 is UBUS–U1, and a voltage between two terminals of the equivalent resistor Rz2 is U1. A relation $$\frac{UBUS-U1}{\dfrac{1}{\dfrac{1}{R1}+\dfrac{1}{RZ1}}} = \frac{U1}{\dfrac{1}{\dfrac{1}{R1+R2}+\dfrac{1}{RZ2}}}$$

may be determined according to a principle that currents in a series circuit are equal, and the relation may be organized into $$(UBUS-U1)\times\left(\frac{1}{R1}+\frac{1}{RZ1}\right) = U1\times\left(\frac{1}{R1+R2}+\frac{1}{RZ2}\right).$$

Similarly, in the second control process, in the insulation detection circuit 110, the first resistor 111 and the second resistor 112 are connected in series and then connected in parallel with the equivalent resistor Rz1. The third resistor 113 and the equivalent resistor Rz2 are connected in parallel. A voltage between the two terminals of the equivalent resistor R1+ is UBUS–U2, and a voltage between the two terminals of the equivalent resistor R1– is U2. A relation $$(UBUS - U2) \times \left(\frac{1}{R1+R2} + \frac{1}{RZ1}\right) = U1 \times \left(\frac{1}{R1} + \frac{1}{RZ2}\right)$$

may be determined according to the principle that currents in a series circuit are equal.

$$Riso = \frac{1}{\frac{1}{RZ1} + \frac{1}{RZ2}} = \frac{1}{\frac{UBUS}{U1-U2} - 1 - \frac{UBUS}{U1-U2} + 1}{R1} - \frac{U1-U2}{R1+R2}$$

may be determined based on the relations obtained in the two control processes. It may be learned from the expression of the ground insulation resistance Riso of the converter 11 that, precision of Riso depends on a difference between the voltages between the ground terminal PE of the converter 11 and the negative electrode bus in two times of control, or a difference Ud=U1–U2 between two disturbance voltages.

It may be learned that detection precision of Riso may be improved by improving precision of the determined difference Ud between the two disturbance voltages.

In a process in which detection is performed by using the foregoing insulation detection circuit structure, it is assumed that a voltage UBUS between the positive electrode bus and the negative electrode bus is 1200 V, R1 is 1800 kΩ, and R2 is 1200 kΩ. If Riso is 50 kΩ, the difference Ud between the voltages detected two times is 12.6 V.

Figure 2:
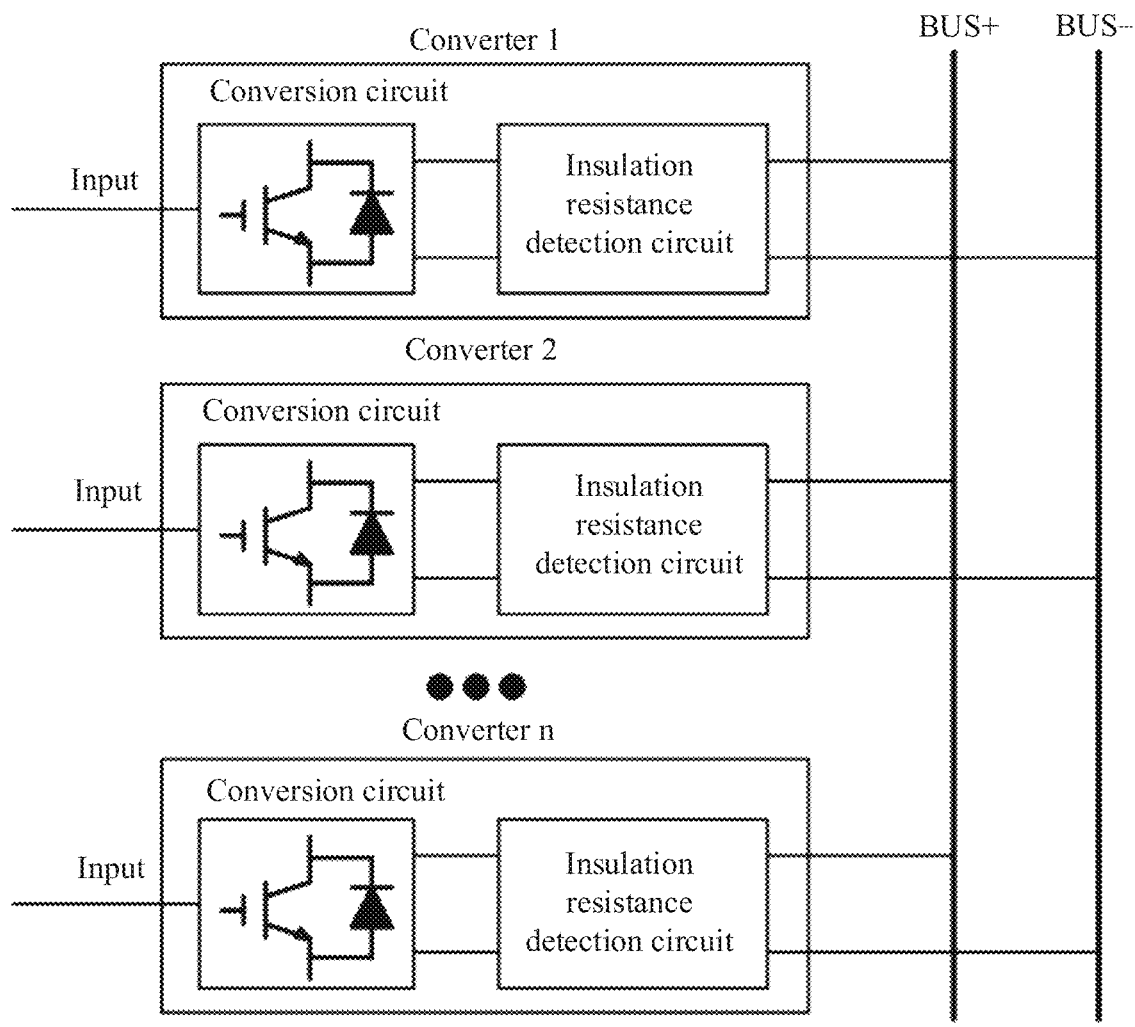
FIG. 2 is a schematic diagram of a structure of a converter system, according to some embodiments.

An example in which a ground insulation resistance of each converter is 50 kΩ is used. FIG. 2 shows a structure of a system in which a plurality of converters are connected in parallel. The plurality of converters are connected in parallel between the positive electrode bus and the negative electrode bus, and each converter includes a conversion circuit and an insulation resistance detection circuit. The converter may be controlled by using a signal received at an input end. If the system in which a plurality of converters are connected in parallel includes 10 converters connected in parallel, a ground insulation resistance of the system is 5 kΩ. In this case, the difference Ud between the voltages detected two times is correspondingly 1.33 V.

The difference Ud between the two disturbance voltages is determined based on U1 and U2, and U1 and U2 are obtained through AD sampling. Therefore, precision of Ud is related to an AD sampling capability. AD sampling of 12 bits is used as an example. If upper limits of U1 and U2 are considered, a sampling circuit meets at least a sampling capability of 1500 V. In this case, a maximum sampling error is $$\frac{2 \times 1500}{4096} = 0.7342 \text{ V}.$$

When Ud is 12.6 V, a maximum sampling deviation is 5.8%. When Ud is 1.33 V, a maximum sampling deviation is 55.1%.

When the ground insulation resistance of the system in which a plurality of converters are connected in parallel is detected directly by using the insulation detection circuit of the converter, because a voltage sampling deviation is very large, detection precision of the ground insulation resistance is reduced, it is difficult to precisely detect the ground insulation resistance of the system, and detection precision is low.

When Ud is large, the maximum sampling deviation is small. Therefore, in a manner, Ud may be increased by reducing a resistance value of a resistor in the insulation detection circuit, to reduce the maximum sampling deviation, and improve detection precision of the ground resistance of the system. It is assumed that a resistance value of each resistor in the foregoing insulation detection circuit is adjusted, R1 is 900 kΩ, and R2 is 600 kΩ. An example in which a ground insulation resistance of each converter is 50 kΩ is used. If the system in which a plurality of converters are connected in parallel includes 10 converters connected in parallel, the ground insulation resistance of the system is 5 kΩ. In this case, the difference Ud of the voltages detected two times is correspondingly 2.64 V, and the maximum deviation is 27.7%.

In this manner, although detection precision of the ground insulation resistance of the system can be improved, a resistor power increases after the resistance value in the insulation detection circuit is reduced. For example, when UBUS is 1500 V, and a relay in the converter is on, a maximum power of the first resistor 111 increases from 1.25 W to 2.5 W. A heating problem may be caused because the resistor power increases in the insulation detection circuit, and a corresponding heat dissipation apparatus further needs to be introduced. Therefore, when detection precision of the insulation resistance of the system is improved by reducing the resistance value of the resistor in the insulation detection circuit, detecting a power of each resistor in the insulation detection circuit is a bottleneck for improving detection precision of the insulation resistance of the system.

In another manner, the AD sampling capability is improved. For example, the voltage UBUS between the positive electrode bus and the negative electrode bus is 1200 V, R1 is 1800 kΩ, and R2 is 1200 kΩ. If the system in which a plurality of converters are connected in parallel includes 10 converters connected in parallel, the ground insulation resistance of the system is 5 kΩ. After AD sampling of 12 bits is improved to AD sampling of 14 bits, the maximum sampling error is $$\frac{2 \times 1500}{16384} = 0.1831 \text{ V}.$$

In this case, the maximum sampling deviation is 13.8%.

In the manner of improving the AD sampling capability, detection precision of the resistance of the system needs to be improved by using a main control chip or an extension chip that has a large quantity of AD conversion bits. For the system in which a plurality of converters are connected in parallel, system costs are increased.

In view of this, this application provides a method of detecting an insulation resistance of a system and a converter system, to improve detection precision of the insulation resistance of the system without increasing system costs.

Figure 3:
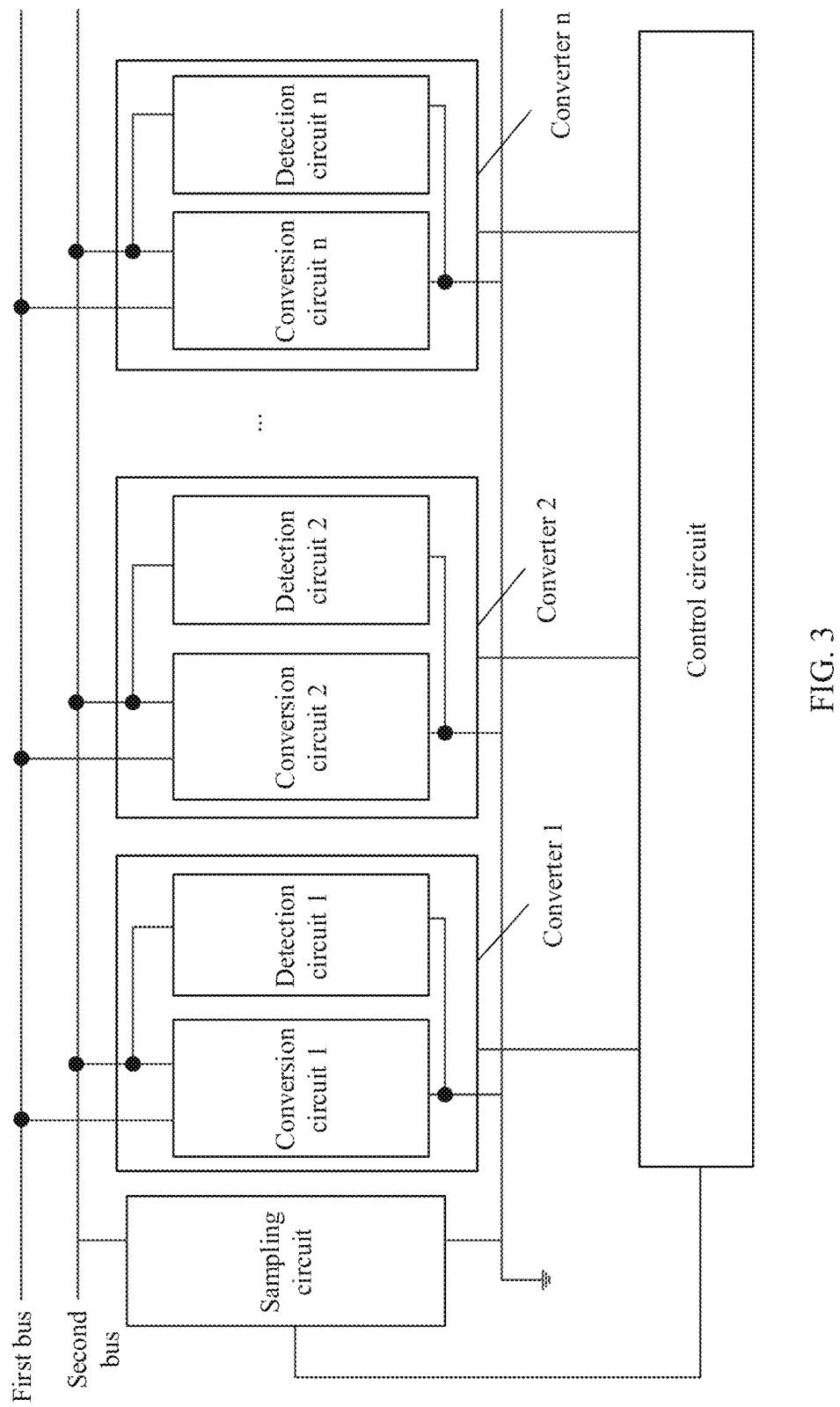
FIG. 3 is a schematic diagram of a structure of another converter system, according to some embodiments.

The method of detecting an insulation resistance of a system provided in an embodiment of this application may be applied to the converter system. The following describes the converter system provided in this embodiment of this application. As shown in FIG. 3, the converter system includes a plurality of converters, a sampling circuit, and a control circuit. The control circuit may be connected to each converter, and the control circuit may control each converter. The converter in this embodiment of this application may be configured to charge and discharge a battery in an energy storage system. For example, the converter may be a direct current/direct current converter. In some embodiments, the converter in this embodiment of this application may be a direct current/alternating current converter, is used in a photovoltaic system, and has a photovoltaic power generation function.

The converter may include a conversion circuit and a detection circuit. The conversion circuit is configured to implement a function of the converter, such as direct current/direct current conversion or direct current/alternating current conversion. The detection circuit is configured to detect a ground insulation resistance of the converter. One terminal of each converter is connected to a first bus, and the other terminal is connected to a second bus. The converter system may further include the control circuit, configured to control each converter, for example, control the conversion circuit to work, or control the detection circuit to detect the ground insulation resistance. The converter system further includes the sampling circuit that is connected between the second bus and a ground cable and that is configured to collect a voltage between the second bus and the ground cable when the ground insulation resistance of the system is detected. The control circuit may be connected to the sampling circuit, and is configured to control the sampling circuit to collect the voltage between the second bus and the ground cable.

In some embodiments, the first bus is a positive electrode bus, and the second bus is a negative electrode bus. In some embodiments, the first bus is a negative electrode bus, and the second bus is a positive electrode bus. In the following embodiment, an example in which the first bus is a positive electrode bus BUS+ and the second bus is a negative electrode bus BUS− is used for description.

The detection circuit of each converter may include a plurality of resistors and at least one switch.

In some embodiments, the plurality of resistors in each detection circuit are connected in series between the second bus and the ground cable. As shown in FIG. 3, the converter system includes n converters, and the converters are connected in parallel between the positive electrode bus and the negative electrode bus. For example, a first terminal of a converter 1 is connected to the positive electrode bus BUS+, a second terminal of the converter 1 is connected to the negative electrode bus BUS−, and a ground terminal of the converter 1 is connected to the ground cable. A manner in which another converter is connected to the positive electrode bus BUS+, the negative electrode bus BUS−, and the ground cable is the same as that of the converter 1. Details are not described herein again.

The detection circuit of each converter is connected between the negative electrode bus BUS− and the ground cable. As shown in FIG. 3, a detection circuit 1 of the converter 1 is connected between the negative electrode bus BUS− and the ground cable. A detection circuit n of a converter n is connected between the negative electrode bus BUS− and the ground cable.

The converter system may further include the control circuit, configured to control each converter, for example, control the conversion circuit to work, or control the detection circuit to detect the ground insulation resistance. The converter system further includes the sampling circuit that is connected between the negative electrode bus BUS− and the ground cable and that is configured to collect a voltage between the negative electrode bus BUS− and the ground cable when the ground insulation resistance of the system is detected. The control circuit may be connected to the sampling circuit, and is configured to control the sampling circuit to collect the voltage between the negative electrode bus BUS− and the ground cable.

In an example, the detection circuit may include at least two resistors and at least one switch. The at least two resistors may be connected in series between the negative electrode bus BUS− and the ground cable, and the at least one switch is connected to any one of the at least two resistors. The control circuit may switch a turn-on/turn-off state of a switch in the detection circuit, to switch a resistor that is in the detection circuit and that is connected between the negative electrode bus BUS− and the ground cable. It should be understood that a resistor that is not connected in parallel with the switch may be replaced by a plurality of resistors connected in series.

Figure 4:
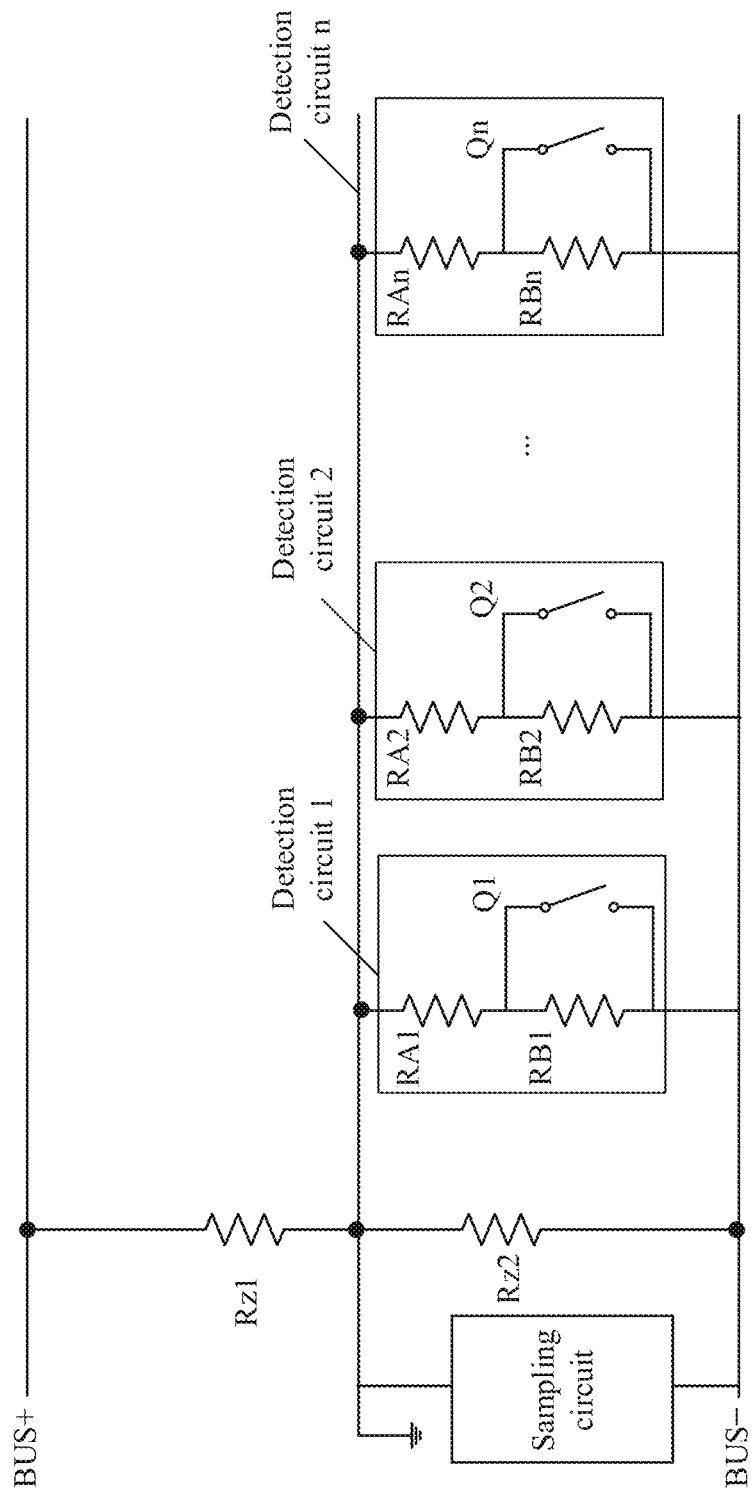
FIG. 4 is a schematic diagram of a structure of a detection circuit in a converter system, according to some embodiments.

As shown in FIG. 4, the detection circuit n may include two detection resistors connected in series and one switching switch Qn, for example, a first detection resistor RAn and a second detection resistor RBn. Similarly, in the detection circuit 1, a first detection resistor is denoted as RA1, a second detection resistor is denoted as RB1, and a switching switch is denoted as Q1. In the plurality of detection circuits shown in FIG. 4, an example in which the switching switch Qn is connected in parallel with the second detection resistor RBn is used. Resistance values of first detection resistors in the detection circuits are the same, and resistance values of second detection resistors in the detection circuits are also the same.

A ground insulation resistance Riso of the converter system may be equivalent to a resistance obtained after a ground insulation resistor Rz1 between the positive electrode bus BUS+ and the ground cable in the converter system is connected in parallel with a ground insulation resistor Rz2 between the negative electrode bus BUS− and the ground cable in the converter system, namely, Riso=Rz1//Rz2. In some embodiments, A//B indicates a resistance value obtained after a resistor A is connected in parallel with a resistor B.

An embodiment of this application provides a method of detecting an insulation resistance of a system, and the method may be performed by the control circuit. The control circuit may control at least one detection circuit to switch a resistor connected between the negative electrode bus BUS− and the ground cable. Generally, an initial state of the switching switch in each detection circuit is a turn-off state. In this case, resistors that are in each detection circuit and that are connected between the negative electrode bus BUS− and the ground cable are the first detection resistor and the second detection resistor that are connected in series.

When detecting the insulation resistance of the system, the control circuit may first control the sampling circuit to collect a voltage Uc1 between the negative electrode bus BUS− and the ground cable. The n detection circuits are connected in parallel. Therefore, when the switching switch in each detection circuit is in a turn-off state, an equivalent detection resistance between the negative electrode bus BUS− and the ground cable is $$\frac{RA1+RB1}{n},$$

a voltage between two terminals of the equivalent ground insulation resistor Rz1 between the positive electrode bus BUS+ and the ground cable is UBUS−Uc1, and a voltage between two terminals of the equivalent ground insulation resistor Rz2 between the negative electrode bus BUS− and the ground cable is Uc1. In this case, a relationship between the equivalent ground insulation resistor Rz1, between the positive electrode bus BUS+ and the ground cable in the system, and the equivalent ground insulation resistor Rz2 between the negative electrode bus BUS− and the ground cable is $$\frac{UBUS - Uc1}{Rz1} = \frac{Uc1}{Rz2 // \frac{RA1 + RB1}{n}}.$$

Then, the control circuit controls at least one detection circuit in the converter system to switch a resistor connected between the negative electrode bus BUS− and the ground cable. For example, the control circuit may control a switching switch in the at least one detection circuit to be in a turn-on state, to switch the resistor that is in the detection circuit and that is connected between the negative electrode bus BUS− and the ground cable.

In an example, the control circuit controls one detection circuit to switch a resistor connected between the negative electrode bus BUS− and the ground cable. In other words, the control circuit controls a switching switch in a switching circuit to be in a turn-on state. For example, the control circuit may control the switching switch Q1 in the detection circuit 1 to be in a turn-on state. Because the switching switch Q1 is in a turn-on state, the second detection resistor RB1 in the detection circuit 1 is short-circuited. Therefore, resistors that are in the detection circuit 1 and that are connected between the negative electrode bus BUS− and the ground cable change from RA1+RA2 to RA1.

In the converter system, resistors that are in (n−1) detection circuits other than the detection circuit 1 and that are connected between the negative electrode bus BUS− and the ground cable do not change. In this case, the equivalent detection resistance between the negative electrode bus BUS− and the ground cable in the converter system is $$\frac{RA1 + RB1}{n - 1} // RA1,$$

namely, $$\frac{RA1 \times (RA1 + RB1)}{nRA1 + RB1}.$$

The control circuit controls the sampling circuit to collect a voltage Uc2 between the negative electrode bus BUS− and the ground cable. After the switching switch in the detection circuit 1 is switched to a turn-on state, the equivalent detection resistance between the negative electrode bus BUS− and the ground cable is $$\frac{RA1 \times (RA1 + RB1)}{nRA1 + RB1},$$

the voltage between the two terminals of the equivalent ground insulation resistor Rz1 between the positive electrode bus BUS+ and the ground cable is UBUS−Uc2, and the voltage between the two terminals of the equivalent ground insulation resistor Rz2 between the negative electrode bus BUS− and the ground cable is Uc2. In this case, the relationship between the equivalent ground insulation resistor Rz1, between the positive electrode bus BUS+ and the ground cable in the system, and the equivalent ground insulation resistor Rz2 between the negative electrode bus BUS− and the ground cable is $$\frac{UBUS - Uc2}{Rz1} = \frac{Uc2}{Rz2 // \frac{RA1 \times (RA1 + RB1)}{nRA1 + RB1}}.$$

The control circuit may determine the equivalent ground insulation resistance Rz2 between the negative electrode bus BUS− and the ground cable and the equivalent ground insulation resistance Rz1 between the positive electrode bus BUS+ and the ground cable in the system based on the relationship $$\frac{UBUS - Uc1}{Rz1} = \frac{Uc1}{Rz2 // \frac{RA1 + RB1}{n}}$$

that exists before the switching switch in the detection circuit 1 is switched to a turn-on state and that is between the equivalent ground insulation resistor Rz1, between the positive electrode bus BUS+ and the ground cable in the system, and the equivalent ground insulation resistor Rz2 between the negative electrode bus BUS− and the ground cable, and the relationship $$\frac{UBUS - Uc2}{Rz1} = \frac{Uc2}{Rz2 // \frac{RA1 \times (RA1 + RB1)}{nRA1 + RB1}}.$$

that exists after the switching switch in the detection circuit 1 is switched to a turn-on state and that is between the equivalent ground insulation resistor Rz1, between the positive electrode bus BUS+ and the ground cable in the system, and the equivalent ground insulation resistor Rz2 between the negative electrode bus BUS− and the ground cable. The ground insulation resistance of the converter system is Rz1//Rz2.

In an actual application scenario, Rz1 and Rz2 may be solved by combining the equation $$\frac{UBUS - Uc1}{Rz1} = \frac{Uc1}{Rz2 // \frac{RA1 + RB1}{n}}$$

and the equation $$\frac{UBUS - Uc2}{Rz1} = \frac{Uc2}{Rz2 // \frac{RA1 \times (RA1 + RB1)}{nRA1 + RB1}}.$$

A relationship among Rz1, UBUS, Uc1, Uc2, RA1, RB1, and n and a relationship among Rz2, UBUS, Uc1, Uc2, RA1, RB1, and n may be solved by combining the two equations.

The control circuit may obtain Rz1 and Rz2 based on a pre-determined relationship among Rz1, UBUS, Uc1, Uc2, RA1, RB1, and n, a pre-determined relationship among Rz2, UBUS, Uc1, Uc2, RA1, RB1, and n, and the results obtained by the sampling circuit through two times of collection before and after the control circuit switches the switching switch in the detection circuit 1 to a turn-on state. Then, the control circuit obtains the ground insulation resistance $$Riso = \frac{Rz1 Rz2}{Rz1 + Rz2}$$

of the converter system by solving a result obtained after Rz1 is connected in parallel with Rz2. In some embodiments, the control circuit may directly obtain the ground insulation resistance Riso of the converter system based on the pre-determined relationship among Rz1, UBUS, Uc1, Uc2, RA1, RB1, and n, the pre-determined relationship among Rz2, UBUS, Uc1, Uc2, RA1, RB1, and n, the results obtained by the sampling circuit through two times of collection before and after the control circuit switches the switching switch in the detection circuit 1 to a turn-on state, and a parallel connection relationship between Rz1 and Rz2.

In some embodiments, when the control circuit also controls, before the control circuit controls the switch Q1 in the detection circuit 1 to be in a turn-on state, the sampling circuit to collect the voltage between the negative electrode bus BUS− and the ground cable, the equivalent detection resistance of the converter system is $$\frac{RA1 + RB1}{n}$$

that is far less than the detection resistance RA1+RB1 that is in a corresponding case and that exists when the ground insulation resistance of the system is detected by using a single converter. When the control circuit also controls, after the control circuit controls the switch Q1 in the detection circuit 1 to be in a turn-on state, the sampling circuit again to collect the voltage between the negative electrode bus BUS− and the ground cable, the equivalent detection resistance of the converter system is $$\frac{RA1 + RB1}{n - 1} // RA1$$

that is also far less than the detection resistance RA1 that is in a corresponding case and that exists when the ground insulation resistance of the system is detected by using a single converter.

Compared with a manner in which the ground insulation resistance of the system is detected by using a single converter, the control circuit uses a plurality of detection circuits to jointly participate in a process of detecting the ground insulation resistance of the system, and reduces the equivalent detection resistance of the system by controlling switches in the plurality of detection circuits. Therefore, Uc1−Uc2 can be increased, a maximum sampling deviation can be reduced, and detection precision of the ground resistance of the system can be improved. In some embodiments, the detection resistor in each detection circuit does not need to be replaced because a plurality of converters are connected in parallel.

In another example, in a process of detecting the ground insulation resistance of the system, the control circuit may control i (i ∈ [1, n]) detection circuits to switch resistors connected between the negative electrode bus BUS− and the ground cable. In other words, the control circuit controls switching switches in i switching circuits to be in a turn-on state. For example, the control circuit may control switching switches from the detection circuit 1 to a detection circuit i to be in a turn-on state, so that resistors that are in each detection circuit from the detection circuit 1 to the detection circuit i and that are connected between the positive electrode bus BUS+ and the negative electrode bus BUS− change from RA1+RB1 to RA1.

In the converter system, resistors that are in (n−i) detection circuits other than the detection circuit 1 to the detection circuit i and that are connected between the negative electrode bus BUS− and the ground cable do not change. In this case, the equivalent detection resistance between the negative electrode bus BUS− and the ground cable in the converter system is $$\frac{RA1 + RB1}{n - i} // \frac{RA1}{i},$$

namely, $$\frac{RA1 \times (RA1 + RB1)}{nRA1 + iRB1}.$$

The control circuit controls the sampling circuit to collect a voltage Uc3 between the negative electrode bus BUS− and the ground cable. After the switching switches in the detection circuit 1 to the detection circuit i are switched to a turn-on state, the equivalent detection resistance between the negative electrode bus BUS− and the ground cable is $$\frac{RA1 \times (RA1 + RB1)}{nRA1 + iRB1},$$

the voltage between the two terminals of the equivalent ground insulation resistor Rz1 between the positive electrode bus BUS+ and the ground cable is UBUS−Uc3, and the voltage between the two terminals of the equivalent ground insulation resistor Rz2 between the negative electrode bus BUS− and the ground cable is Uc3. In this case, the relationship between the equivalent ground insulation resistor Rz1, between the positive electrode bus BUS+ and the ground cable in the system, and the equivalent ground insulation resistor Rz2 between the negative electrode bus BUS− and the ground cable is $$\frac{UBUS - Uc3}{Rz1} = \frac{Uc3}{Rz2 // \frac{RA1 \times (RA1 + RB1)}{nRA1 + iRB1}}.$$

The control circuit may determine the equivalent ground insulation resistance Rz2 between the negative electrode bus BUS− and the ground cable and the equivalent ground insulation resistance Rz1 between the positive electrode bus BUS+ and the ground cable in the system based on the relationship $$\frac{UBUS - Uc1}{Rz1} = \frac{Uc1}{Rz2 // \frac{RA1 + RB1}{n}}$$

that exists before the switching switches in the detection circuit 1 to the detection circuit i are switched to a turn-on state and that is between the equivalent ground insulation resistor Rz1, between the positive electrode bus BUS+ and the ground cable in the system, and the equivalent ground insulation resistor Rz2 between the negative electrode bus BUS− and the ground cable, and the relationship $$\frac{UBUS - Uc3}{Rz1} = \frac{Uc3}{Rz2 // \frac{RA1 \times (RA1 + RB1)}{nRA1 + iRB1}}$$

that exists after the switching switches in the detection circuit 1 to the detection circuit i are switched to a turn-on state and that is between the equivalent ground insulation resistor Rz1, between the positive electrode bus BUS+ and the ground cable in the system, and the equivalent ground insulation resistor Rz2 between the negative electrode bus BUS− and the ground cable. The ground insulation resistance of the converter system is Rz1//Rz2.

Similarly, Rz1 and Rz2 may be solved by combining the equation $$\frac{UBUS - Uc1}{Rz1} = \frac{Uc1}{Rz2 // \frac{RA1 \times (RA1 + RB1)}{nRA1 + RB1}}$$

and the equation $$\frac{UBUS - Uc3}{Rz1} = \frac{Uc3}{Rz2 // \frac{RA1 \times (RA1 + RB1)}{nRA1 + iRB1}}.$$

A relationship among Rz1, UBUS, Uc1, Uc3, RA1, RB1, n and i and a relationship among Rz2, UBUS, Uc1, Uc3, RA1, RB1, and n may be solved by combining the two equations.

The control circuit may obtain Rz1 and Rz2 based on a pre-determined relationship among Rz1, UBUS, Uc1, Uc3, RA1, RB1, n, and i, a pre-determined relationship among Rz2, UBUS, Uc1, Uc3, RA1, RB1, n, and i, and the results obtained by the sampling circuit through two times of collection before and after the control circuit switches the switching switches in the detection circuit 1 to the detection circuit i to a turn-on state. Then, the control circuit obtains the ground insulation resistance $$Riso = \frac{Rz1 Rz2}{Rz1 + Rz2}$$

of the converter system by solving a result obtained after Rz1 is connected in parallel with Rz2.

In some embodiments, the control circuit may directly obtain the ground insulation resistance Riso of the converter system based on the pre-determined relationship among Rz1, UBUS, Uc3, Uc2, RA1, RB1, n, and i, the pre-determined relationship among Rz2, UBUS, Uc1, Uc3, RA1, RB1, n, and i, the results obtained by the sampling circuit through two times of collection before and after the control circuit switches the switching switches in the detection circuit 1 to the detection circuit i to a turn-on state, and a parallel connection relationship between Rz1 and Rz2.

In some embodiments, when the control circuit controls the i (i ∈ [1, n]) detection circuits to switch the resistors connected between the negative electrode bus BUS− and the ground cable, the control circuit may control any i detection circuits in the n detection circuits to perform switching. In some embodiments, the control circuit may select, in a preset manner, i detection circuits from the n detection circuits to perform switching, for example, determine i detection circuits based on sorting of converter identifiers, or determine i detection circuits based on a priority of the converter.

In some embodiments, when the control circuit also controls, after the control circuit controls the switches in the i detection circuits to be in a turn-on state, the sampling circuit again to collect the voltage between the negative electrode bus BUS− and the ground cable, the equivalent detection resistance of the converter system is $$\frac{RA1 + RB1}{n - i} // \frac{RA1}{i}.$$

If i is greater than 1, $$\frac{RA1 + RB1}{n - i} // \frac{RA1}{i}.$$

is less than $$\frac{RA1 + RB1}{n - 1} // RA1.$$

In some embodiments, $$\frac{RA1 + RB1}{n - i} // \frac{RA1}{i}$$

decreases as i increases. It may be learned that, the control circuit controls switches in more detection circuits to be in a turn-on state, that is, controls more detection circuits to reduce resistors connected between the negative electrode bus BUS− and the ground cable, so that a value of the equivalent detection resistance of the system can be further reduced. In this way, Uc1−Uc2 is larger, a maximum sampling deviation is reduced, and detection precision of the ground resistance of the system is improved.

In some embodiments, when the control circuit obtains Uc1, the switching switches in the detection circuits are in a turn-off state, that is, switching switches in i=0 detection circuits are in a turn-on state. When Uc3 is obtained, the switching switches in the i detection circuits are in a turn-on state.

In some embodiments, the control circuit may further control switching switches in j (j ∈ [0, n]) detection circuits to be in a turn-off state, and obtain a first voltage between the negative electrode bus BUS− and the ground cable; and then control switching switches in i (i ∈ [0, n]) detection circuits to be in a turn-off state, and obtain a second voltage between the negative electrode bus BUS− and the ground cable, where i is not equal to j. The control circuit may determine the ground insulation resistance of the converter system according to the following formula:

$$Riso = \frac{Rz1 \times Rz2}{Rz1 + Rz2}$$

where Riso is the ground insulation resistance of the converter, Rz2 is an insulation resistance between the second bus and the ground cable, Rz1 is an insulation resistance between the first bus and the ground cable, $$Rz2 = \frac{Rd1 \times Rd2 - \frac{VB - V2}{VB - V1} \times \frac{V1}{V2} \times Rd1 \times Rd2}{\frac{VB - V2}{VB - V1} \times \frac{V1}{V2} \times Rd2 - Rd1},$$

$$\text{and } Rz1 = \frac{VB - V1}{V1} \times \frac{Rz2 Rd1}{Rz2 + Rd1};$$

and

Rd1 is an equivalent detection resistance that is between the second bus and the ground cable and that exists when the switching switches in the i detection circuits are in a turn-on state, Rd2 is an equivalent detection resistance that is between the second bus and the ground cable and that exists when the switching switches in the j detection circuits are in a turn-on state, $$Rd1 = \frac{RA \times (RA + RB)}{nRA + iRB}, \; Rd2 = \frac{RA \times (RA + RB)}{nRA + jRB},$$

i is the first quantity, i ∈ [0, n], j is the second quantity, j ∈ [0, n], i≠j, RB is RB1, RA is RA1, n is a quantity of converters in the system, VB is UBUS, V1 is the first voltage, and V2 is the second voltage.

In some embodiments, the plurality of resistors in each detection circuit are connected in series between the first bus and the second bus. In some embodiments, a first end of the detection circuit of each converter is connected to the first bus, a second end is connected to the second bus, and a third end is connected to the ground cable.

Figure 5:
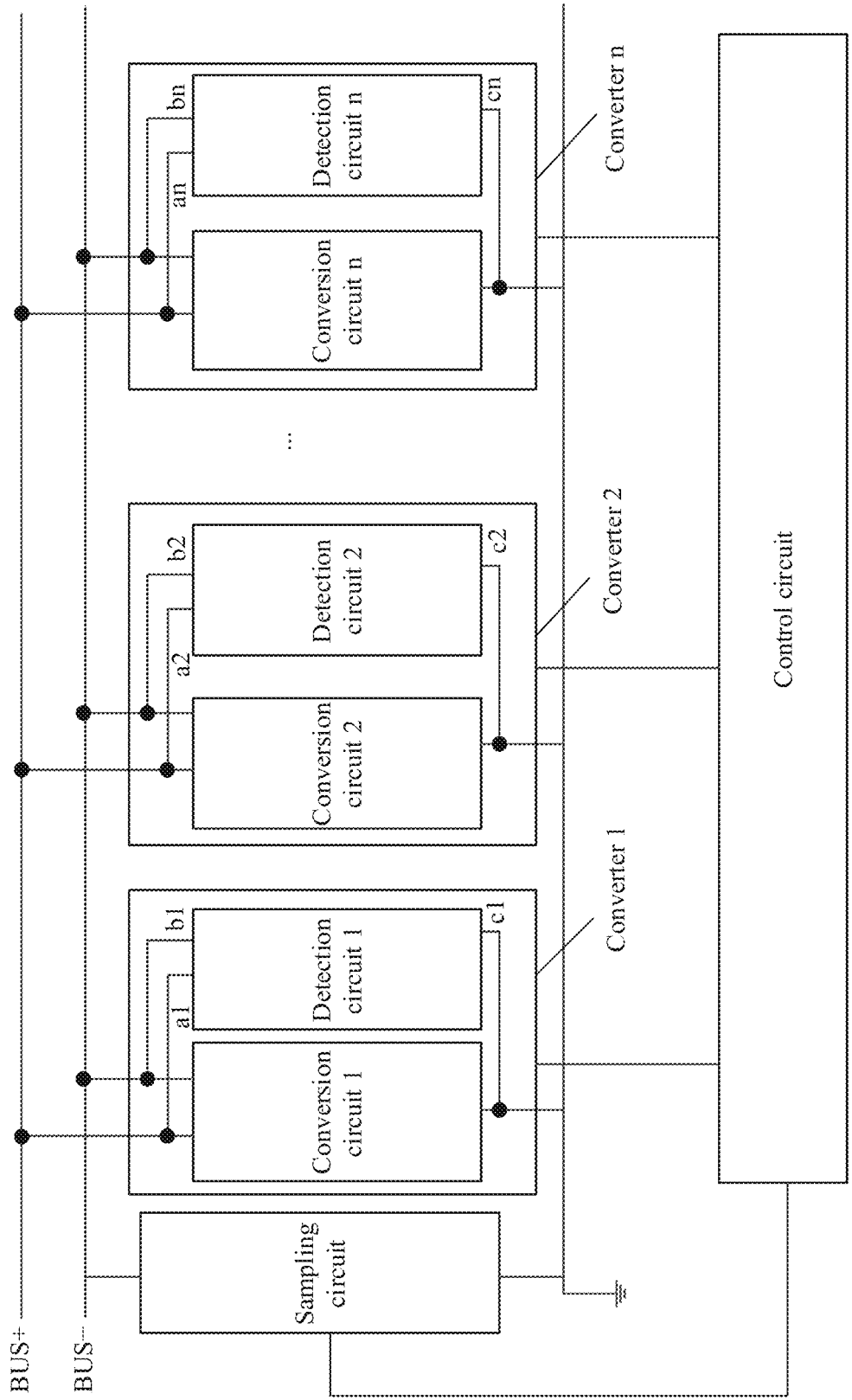
FIG. 5 is a schematic diagram of a structure of still another converter system, according to some embodiments.

As shown in FIG. 5, a first end a1 of a detection circuit 1 of a converter 1 is connected to the positive electrode bus BUS+, a second end b 1 of the detection circuit 1 is connected to the negative electrode bus BUS−, and a third end c1 of the detection circuit 1 is connected to the ground cable. A first end an of a detection circuit n of a converter n is connected to the positive electrode bus BUS+, a second end bn of the detection circuit n is connected to the negative electrode bus BUS−, and a third end cn of the detection circuit n is connected to the ground cable. The detection circuit n of the converter n is connected between the negative electrode bus BUS− and the ground cable.

The converter system may further include the control circuit, configured to control each converter, for example, control the conversion circuit to work, or control the detection circuit to detect the ground insulation resistance. The converter system further includes the sampling circuit that is connected between the negative electrode bus BUS− and the ground cable and that is configured to collect a voltage between the negative electrode bus BUS− and the ground cable when the ground insulation resistance of the system is detected. The control circuit may also be connected to the sampling circuit, and is configured to control the sampling circuit to collect the voltage between the negative electrode bus BUS− and the ground cable.

In some embodiments, in the plurality of resistors included in each detection circuit, at least one resistor is connected between the first bus and the ground cable, and at least two resistors are connected between the second bus and the ground cable, or at least one resistor is connected between the second bus and the ground cable, and at least one resistor is connected between the first bus and the ground cable. In the following embodiment, an example in which at least one resistor is connected between the first bus and the ground cable and at least two resistors are connected between the second bus and the ground cable is used for description.

In an example, the detection circuit includes a plurality of resistors and one switch, one resistor is connected between the first bus and the ground cable, two resistors are connected between the second bus and the ground cable, and the switch is connected in parallel with one of the two resistors.

Figure 6:
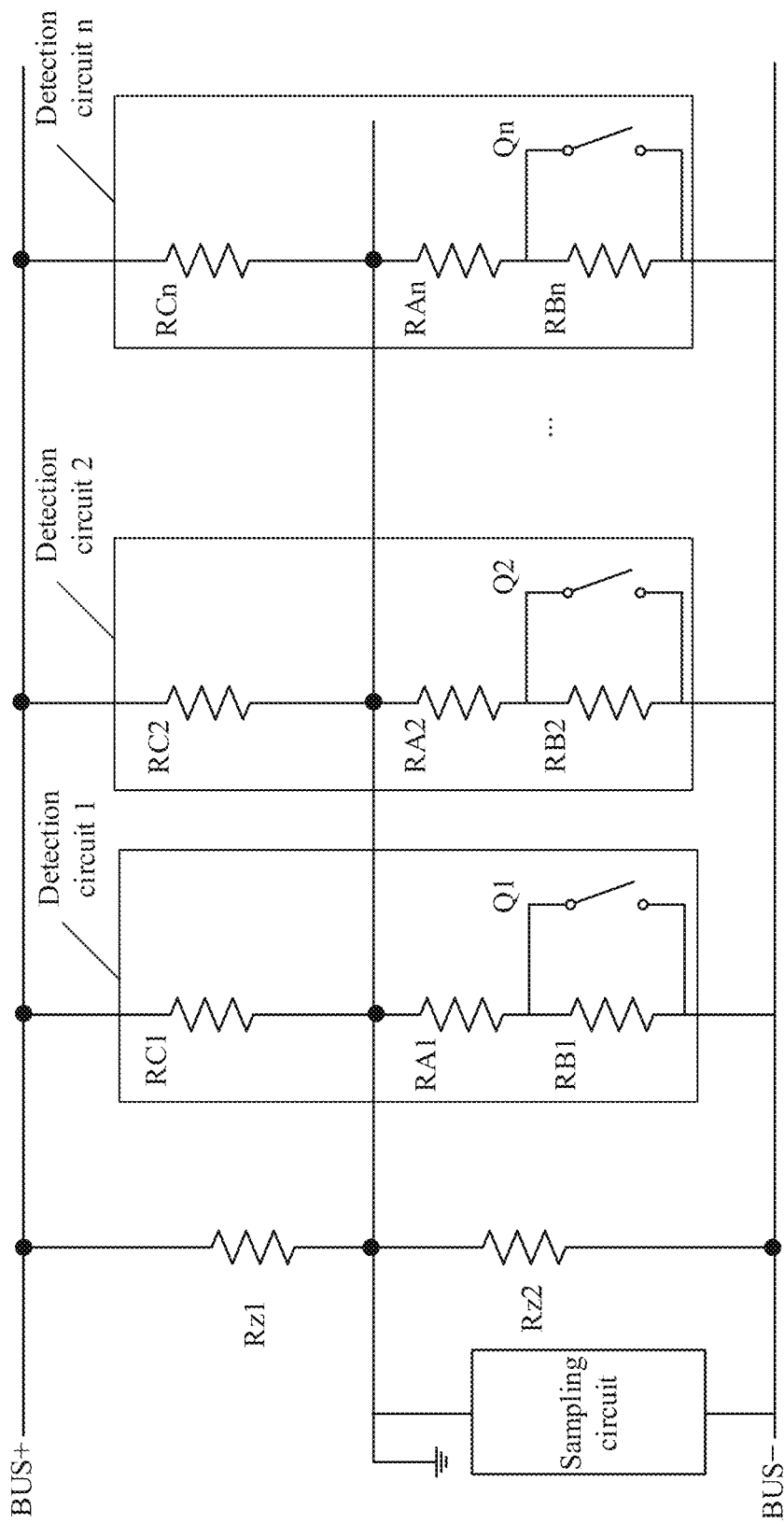
FIG. 6 is a schematic diagram of a structure of a detection circuit in another converter system, according to some embodiments.

As shown in FIG. 6, the detection circuit n may include three detection resistors connected in series and one switching switch Qn, for example, a first detection resistor RAn, a second detection resistor RBn, and a third detection resistor RCn. There is at least one detection resistor between a ground terminal of the converter n and the positive electrode bus BUS+, and there is at least one detection resistor between the ground terminal of the converter n and the negative electrode bus BUS−. As shown in FIG. 6, the third detection resistor RCn is connected between the positive electrode bus BUS+ and the ground cable. Similarly, in the detection circuit 1, a first detection resistor is denoted as RA1, a second detection resistor is denoted as RB1, a third detection resistor is denoted as RC1, and a switching switch is denoted as Q1. Generally, a resistance value of RC1 is greater than resistance values of RA1 and RB1. For example, the resistance value of RC1 is a sum of the resistance values of RA1 and RB1. Resistance values of first detection resistors in the detection circuits are the same, resistance values of second detection resistors in the detection circuits are also the same, and resistance values of third detection resistors in the detection circuits are also the same.

When the switching switch in each detection circuit is in a turn-off state, an equivalent detection resistance Rd1 between the positive electrode bus BUS+ and the ground cable is $$\frac{RC1}{n},$$

and an equivalent detection resistance Rd2 between the negative electrode bus BUS− and the ground cable is $$\frac{RA1 + RB1}{n}.$$

The control circuit may control the sampling circuit to collect a voltage Uc4 between the negative electrode bus BUS− and the ground cable. In this case, a relationship between the equivalent ground insulation resistor Rz1, between the positive electrode bus BUS+ and the ground cable in the system, and the equivalent ground insulation resistor Rz2 between the negative electrode bus BUS− and the ground cable is $$\frac{UBUS - Uc4}{Rz1 // \frac{RC1}{n}} = \frac{Uc4}{Rz2 // \frac{RA1 + RB1}{n}}.$$

Then, the control circuit may control i (i ∈ [1, n]) detection circuits to switch resistors connected between the positive electrode bus BUS+ and the negative electrode bus BUS−. In other words, the control circuit controls switching switches in i switching circuits to be in a turn-on state. For example, the control circuit may control switching switches from the detection circuit 1 to a detection circuit i to be in a turn-on state, so that resistors that are in each detection circuit from the detection circuit 1 to the detection circuit i and that are connected between the positive electrode bus BUS+ and the negative electrode bus BUS− change from RA1+RB1+RC1 to RA1+RC1.

After controlling the i detection circuits to switch the resistors connected between the positive electrode bus BUS+ and the negative electrode bus BUS−, the control circuit controls the sampling circuit to collect a voltage Uc5 between the negative electrode bus BUS− and the ground cable. When the switching switches in the i detection circuits are in a turn-on state, the equivalent detection resistance Rd1 between the positive electrode bus BUS+ and the ground cable is $$\frac{RC1}{n},$$

and the equivalent detection resistance Rd2 between the negative electrode bus BUS− and the ground cable is $$\frac{RA1 \times (RA1 + RB1)}{nRA1 + iRB1}.$$

After controlling the i (i ∈ [1, n]) detection circuits to switch the resistors connected between the positive electrode bus BUS+ and the negative electrode bus BUS−, the control circuit may control the sampling circuit to collect the voltage Uc5 between the negative electrode bus BUS− and the ground cable. In this case, the relationship between the equivalent ground insulation resistor Rz1, between the positive electrode bus BUS+ and the ground cable in the system, and the equivalent ground insulation resistor Rz2 between the negative electrode bus BUS− and the ground cable is $$\frac{UBUS - Uc5}{Rz1 // \frac{RC1}{n}} = \frac{Uc5}{Rz2 // \frac{RA1 \times (RA1 + RB1)}{nRA1 + iRB1}}.$$

Rz1 and Rz2 may be solved by combining the equation $$\frac{UBUS - Uc4}{Rz1 // \frac{RC1}{n}} = \frac{Uc4}{Rz2 // \frac{RA1 + RB1}{n}}$$

and the equation $$\frac{UBUS - Uc5}{Rz1 // \frac{RC1}{n}} = \frac{Uc5}{Rz2 // \frac{RA1 \times (RA1 + RB1)}{nRA1 + iRB1}}.$$

A relationship among Rz1, UBUS, Uc4, Uc5, RA1, RB1, RC1, n, and i and a relationship among Rz2, UBUS, Uc1, Uc3, RA1, RB1, RC1, n, and i may be solved by combining the two equations.

The control circuit may obtain Rz1 and Rz2 based on a pre-determined relationship among Rz1, UBUS, Uc1, Uc3, RA1, RB1, RC1, n, and i, a pre-determined relationship among Rz2, UBUS, Uc1, Uc3, RA1, RB1, RC1, n, and i, and the results obtained by the sampling circuit through two times of collection before and after the control circuit switches the switching switches in the detection circuit 1 to the detection circuit i to a turn-on state. Then, the control circuit obtains the ground insulation resistance $$Riso = \frac{Rz1 Rz2}{Rz1 + Rz2}$$

of the converter system by solving a result obtained after Rz1 is connected in parallel with Rz2.

In some embodiments, when the switching switch in each detection circuit is in a turn-off state, the control circuit may control the sampling circuit to collect the voltage between the negative electrode bus BUS− and the ground cable. Next, the control circuit controls a switching switch in at least one of the plurality of detection circuits to be in a turn-on state, so that the equivalent detection resistance of the converter system changes. Then, the control circuit controls the sampling circuit to collect the voltage between the negative electrode bus BUS− and the ground cable. The ground insulation resistance of the system may be determined based on the two voltages collected by the sampling circuit, a bus voltage, each detection resistor in the detection circuit, a quantity of detection circuits, and a quantity of detection circuits that are controlled to switch the resistors connected between the positive electrode bus and the negative electrode bus.

In some embodiments, the equivalent detection resistance Rd1 that is between the positive electrode bus BUS+ and the ground cable in the converter system and that exists before the control circuit controls the switches in the i detection circuits to be in a turn-on state is $$\frac{RC1}{n},$$

and the equivalent detection resistance Rd1 that is between the positive electrode bus BUS+ and the ground cable and that exists after the control circuit controls the switches in the i detection circuits to be in a turn-on state is also $$\frac{RC1}{n}.$$

Compared with the detection resistance RC1 in a detection circuit of a single converter, the equivalent detection resistance Rd1 between the positive electrode bus BUS+ and the ground cable is far less than RC1.

In some embodiments, the equivalent detection resistance Rd2 that is between the negative electrode bus BUS− and the ground cable in the converter system and that exists before the control circuit controls the switches in the i detection circuits to be in a turn-on state is $$\frac{RA1 + RB1}{n},$$

and is less than the detection resistance RA1+RB1 in the detection circuit of the single converter in a corresponding case. The equivalent detection resistance Rd2 that is between the negative electrode bus BUS− and the ground cable in the converter system and that exists after the control circuit controls the switches in the i detection circuits to be in a turn-on state is $$\frac{RA1 \times (RA1 + RB1)}{nRA1 + iRB1},$$

and is also less than the detection resistance RA1 in the detection circuit of the single converter in a corresponding case.

For the i detection circuits controlled by the control circuit, a larger quantity i of controlled detection circuits indicates a smaller equivalent detection resistance Rd2 between the negative electrode bus BUS− and the ground cable. Therefore, in a process of detecting the ground insulation resistance of the converter system, the control circuit may control switches in more detection circuits to be in a turn-on state, that is, control more detection circuits to reduce resistors connected between the negative electrode bus BUS− and the ground cable, so that a value of the equivalent detection resistance of the system can be further reduced. In this way, Uc1−Uc2 is larger, a maximum sampling deviation is reduced, and detection precision of the ground resistance of the system is improved.

In some embodiments, the control circuit may further control switching switches in j (j ∈ [0, n]) detection circuits to be in a turn-off state, and obtain a first voltage between the negative electrode bus BUS− and the ground cable; and then control switching switches in i (i ∈ [0, n]) detection circuits to be in a turn-off state, and obtain a second voltage between the negative electrode bus BUS− and the ground cable, where i is not equal to j.

The control circuit may determine the ground insulation resistance of the converter system according to the following formula:

$$Riso = \frac{Rz1 \times Rz2}{Rz1 + Rz2}$$

where Riso is the ground insulation resistance of the converter, Rz2 is an insulation resistance between the second bus and the ground cable, Rz1 is an insulation resistance between the first bus and the ground cable, $$Rz2 = \frac{Rd1 \times Rd2 - \frac{VB - V2}{VB - V1} \times \frac{V1}{V2} \times Rd1 \times Rd2}{\frac{VB - V2}{VB - V1} \times \frac{V1}{V2} \times Rd2 - Rd1},$$

-continued $$\text{and } Rz1 = \frac{\frac{VB - V1}{V1} \times \frac{Rz2Rd1}{Rz2 + Rd1}}{RC - n \times \frac{VB - V1}{V1} \times \frac{+Rz2Rd1}{Rz2 + Rd1}};$$

and

Rd1 is an equivalent detection resistance that is between the second bus and the ground cable and that exists when the switching switches in i detection circuits are in a turn-on state, Rd2 is an equivalent detection resistance that is between the second bus and the ground cable and that exists when the switching switches in the detection circuits of the second quantity are in a turn-on state, $$Rd1 = \frac{RA \times (RA + RB)}{nRA + iRB}, Rd2 = \frac{RA \times (RA + RB)}{nRA + jRB},$$

i is the first quantity, i ∈ [0, n], j is the second quantity, j ∈ [0, n], i≠j, RB is RB1, RA is RA1, RC is RC1, n is a quantity of the plurality of converters, VB is UBUS, V1 is the first voltage, and V2 is the second voltage.

In another example, the detection circuit includes a plurality of resistors and two switches. At least two resistors are connected between the first bus and the ground cable, and one of the resistors is connected in parallel with one switch. At least two resistors are connected between the second bus and the ground cable, and one of the resistors is connected in parallel with the other switch.

Figure 7:
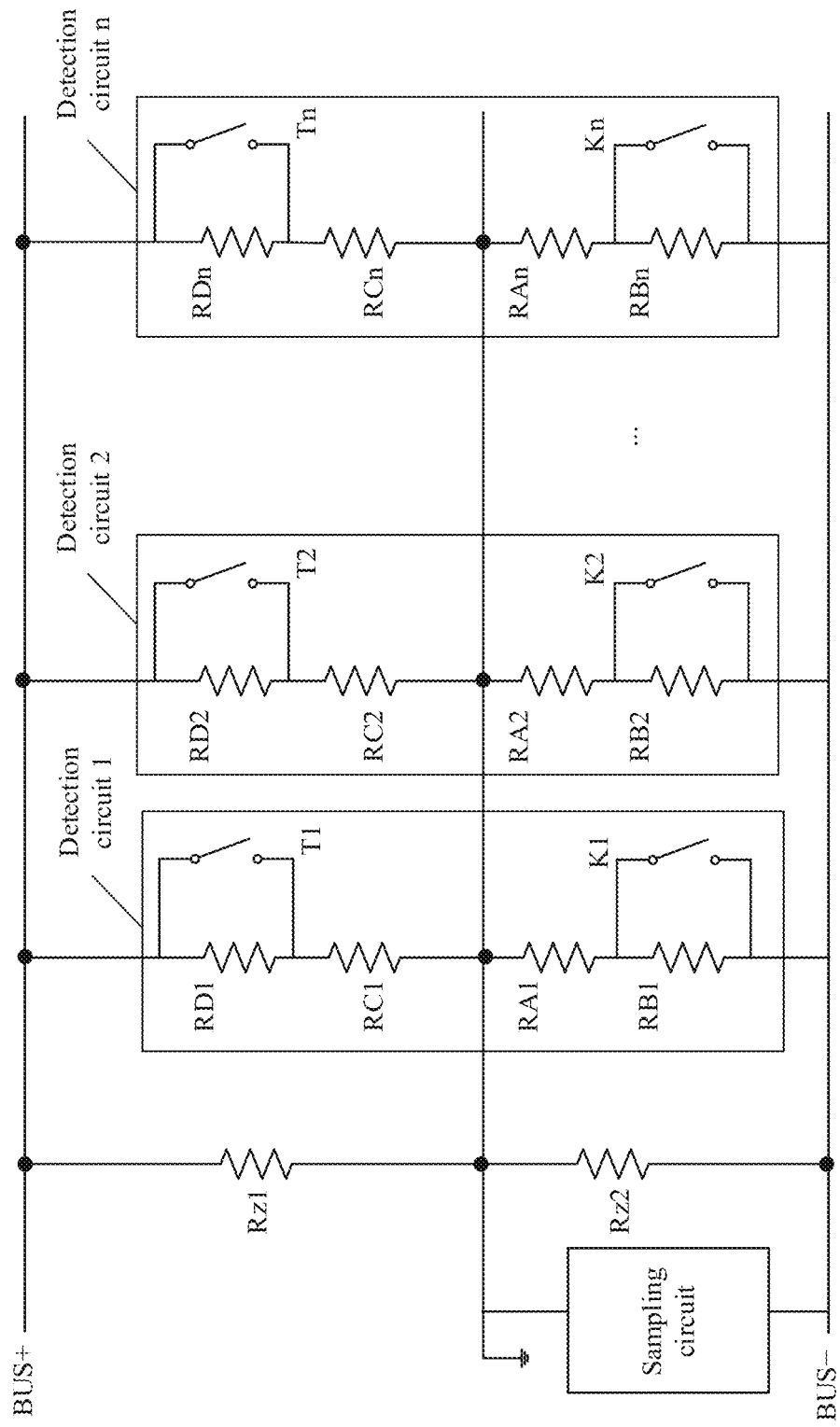
FIG. 7 is a schematic diagram of a structure of a detection circuit in still another converter system, according to some embodiments.

As shown in FIG. 7, the detection circuit n may include four detection resistors and two switching switches, for example, a first detection resistor RAn, a second detection resistor RBn, a third detection resistor RCn, and a fourth detection resistor RDn, a first switching switch Kn, and a second switching switch Tn. The first detection resistor RAn and the second detection resistor RBn are connected between the negative electrode bus BUS− and the ground cable. The third detection resistor RCn and the fourth detection resistor RDn are connected between the positive electrode bus BUS+ and the ground cable. The first switching switch Kn may be connected in parallel with either of the first detection resistor RAn or the second detection resistor RBn. For example, the first switching switch Kn is connected in parallel with the second detection resistor RBn. The second switching switch Tn may be connected in parallel with either one of the third detection resistor RCn or the fourth detection resistor RDn. For example, the second switching switch Tn is connected in parallel with the fourth detection resistor RDn.

The control circuit may switch a turn-on/turn-off state of the first switching switch and the second switching switch, to switch resistors that are in the detection circuit and that are connected between the positive electrode bus and the negative electrode bus. For example, in the detection circuit n, if both the first switching switch Kn and the second switching switch Tn are in a turn-off state, the resistors connected between the positive electrode bus and the negative electrode bus are RAn+RBn+RCn+RDn. If the first switching switch Kn is in a turn-off state, and the second switch Tn is in a turn-on state, the fourth detection resistor RDn is short-circuited, and the resistors connected between the positive electrode bus and the negative electrode bus are RAn+RBn+RCn. If the first switching switch Kn is in a turn-on state, and the second switching switch Tn is in a turn-off state, the second detection resistor is short-circuited, and the resistors connected between the positive electrode bus and the negative electrode bus are RAn+RCn+RDn. If the first switching switch Kn is in a turn-on state, and the second switching switch Tn is in a turn-on state, the second detection resistor RBn and the fourth detection resistor RDn are short-circuited, and the resistors connected between the positive electrode bus and the negative electrode bus are RAn+RCn.

The control circuit may flexibly control first switching switches and second switching switches in a plurality of detection circuits, to switch resistors that are in at least one of the plurality detection circuits and that are connected between the positive electrode bus and the negative electrode bus. The control circuit may control, before switching the resistors that are in the at least one of the plurality detection circuits and that are connected between the positive electrode bus and the negative electrode bus, the sampling circuit to collect a voltage between the negative electrode bus and the ground cable, and control, after switching the resistors that are in the at least one of the plurality detection circuits and that are connected between the positive electrode bus and the negative electrode bus, the sampling circuit again to collect the voltage between the negative electrode bus and the ground cable.

The control circuit may determine the ground insulation resistance Riso of the system by using an equivalent detection resistor Rd1, connected between the positive electrode bus and the ground cable, and an equivalent detection resistor Rd2, connected between the negative electrode bus and the ground cable, that exist before the resistors that are in the at least one of the plurality of detection circuits in the converter system and that are connected between the positive electrode bus and the negative electrode bus are switched; an equivalent detection resistor Rd3, connected between the positive electrode bus and the ground cable in the plurality of detection circuits, and an equivalent detection resistor Rd4, connected between the negative electrode bus and the ground cable, that exist after the resistors that are in the at least one of the plurality of detection circuits in the converter system and that are connected between the positive electrode bus and the negative electrode bus are switched; and the two voltages collected by the sampling circuit.

In some embodiments, the control circuit may control first switching switches in i (i ∈ [1, n]) detection circuits to be in a turn-on state. In this case, an equivalent detection resistance between the positive electrode bus BUS+ and the ground cable in the converter system is $$\frac{RC1 + RD1}{n},$$

and an equivalent detection resistance between the negative electrode bus BUS− and the ground cable in the converter system is $$\frac{RA1 \times (RA1 + RB1)}{nRA1 + iRB1},$$

Then, the control circuit controls the sampling circuit to collect a voltage between the negative electrode bus BUS− and the ground cable, and the voltage is denoted as Uc7. A relationship between the equivalent resistor Rz1, between the positive electrode bus BUS+ and the ground cable in the converter system, and the equivalent resistor Rz2 between the negative electrode bus BUS− and the ground cable is $$\frac{UBUS - Uc7}{Rz1 // \frac{RC1 + RD1}{n}} = \frac{Uc7}{Rz2 // \frac{RA1 \times (RA1 + RB1)}{nRA1 + iRB1}}.$$

The control circuit may control second switching switches in j (j ∈ [1, n]) detection circuits to be in a turn-on state. In this case, the equivalent detection resistance between the positive electrode bus BUS+ and the ground cable in the converter system is $$\frac{RC1 \times (RC1 + RD1)}{nRC1 + jRD1},$$

and the equivalent detection resistance between the negative electrode bus BUS− and the ground cable in the converter system is $$\frac{RA1 + RB1}{n}.$$

Then, the control circuit controls the sampling circuit to collect a voltage between the negative electrode bus BUS− and the ground cable, and the voltage is denoted as Uc8. The relationship between the equivalent resistor Rz1, between the positive electrode bus BUS+ and the ground cable in the converter system, and the equivalent resistor Rz2 between the negative electrode bus BUS− and the ground cable is $$\frac{UBUS - Uc8}{Rz1 // \frac{RC1 \times (RC1 + RD1)}{nRC1 + jRD1}} = \frac{Uc8}{Rz2 // \frac{RA1 + RB1}{n}}.$$

Rz1 and Rz2 may be solved by combining the equation $$\frac{UBUS - Uc7}{Rz1 // \frac{RC1 + RD1}{n}} = \frac{Uc7}{Rz2 // \frac{RA1 \times (RA1 + RB1)}{nRA1 + iRB1}}$$

and the equation $$\frac{UBUS - Uc8}{Rz1 // \frac{RC1 \times (RC1 + RD1)}{nRC1 + jRD1}} = \frac{Uc8}{Rz2 // \frac{RA1 + RB1}{n}}.$$

In some embodiments, a relationship among Rz1, UBUS, Uc7, Uc8, RA1, RB1, RC1, RD1, n, j, and i and a relationship among Rz2, UBUS, Uc7, Uc8, RA1, RB1, RC1, RD1, n, j, and i may be solved by combining the two equations. Based on the relationship among the ground insulation resistance Riso of the converter system, Rz1, and Rz2, a relationship among the ground insulation resistance Riso of the converter system, UBUS, Uc7, Uc8, RA1, RB1, RC1, RD1, n, j, and i may be determined.

The control circuit may determine the ground insulation resistance of the converter system based on the two voltages collected by the sampling circuit and the relationship among the ground insulation resistance Riso of the converter system, UBUS, Uc7, Uc8, RA1, RB1, RC1, RD1, n, j, and i, to detect the ground insulation resistance of the system in which a plurality of converters are connected in parallel.

In an example, RC1 may be equal to RB1, and RA1 may be equal to RD1. The control circuit may control first switching switches in n detection circuits to be in a turn-on state. An equivalent detection resistance between the positive electrode bus BUS+ and the ground cable in the converter system is $$\frac{RC1 + RD1}{n},$$

and an equivalent detection resistance between the negative electrode bus BUS− and the ground cable in the converter system is $$\frac{RA1}{n}.$$

The sampling circuit collects a voltage between the negative electrode bus BUS− and the ground cable, and the voltage is denoted as Uc9. A relationship between the equivalent resistor Rz1, between the positive electrode bus BUS+ and the ground cable in the converter system, and the equivalent resistor Rz2 between the negative electrode bus BUS− and the ground cable is $$\frac{UBUS - Uc9}{Rz1 // \frac{RC1+RD1}{n}} = \frac{Uc9}{Rz2 // \frac{RA1}{n}}.$$

The control circuit may control second switching switches in the n detection circuits to be in a turn-on state. In this case, the equivalent detection resistance between the positive electrode bus BUS+ and the ground cable in the converter system is $$\frac{RC1}{n},$$

and the equivalent detection resistance between the negative electrode bus BUS− and the ground cable in the converter system is $$\frac{RA1 + RB1}{n}.$$

Then, the control circuit controls the sampling circuit to collect a voltage between the negative electrode bus BUS− and the ground cable, and the voltage is denoted as Uc10. The relationship between the equivalent resistor Rz1, between the positive electrode bus BUS+ and the ground cable in the converter system, and the equivalent resistor Rz2 between the negative electrode bus BUS− and the ground cable is $$\frac{UBUS - Uc10}{Rz1 // \frac{RC1}{n}} = \frac{Uc8}{Rz2 // \frac{RA1 + RB1}{n}}.$$

A relationship among the ground insulation resistance Riso of the converter system, UBUS, Uc9, Uc10, RA1, RB1, RC1, RD1, n, j, and i may be solved by combining the equations $$\frac{UBUS - Uc9}{Rz1 // \frac{Rc1+RD1}{n}} = \frac{Uc9}{Rz2 // \frac{RA1}{n}} \text{ and}$$

$$\frac{UBUS - Uc10}{Rz1 // \frac{Rc1}{n}} = \frac{Uc8}{Rz2 // \frac{RA1+RB1}{n}},$$

where RC1=RB1, RA1=RD1, i=n, and j=n. The ground insulation resistance of the converter system is $$Riso = \frac{1}{\frac{\frac{UBUS}{Uc9 - Uc10} - 1}{\frac{RA1}{n}} - \frac{\frac{UBUS}{Uc9 - Uc10} + 1}{\frac{RA1 + RB1}{n}}}.$$

Compared with a manner in which the ground insulation resistance is detected by using a single converter, the equivalent detection resistances Rd1 that are between the positive electrode bus BUS+ and the ground cable in the converter system and that exist before and after the control circuit controls the first switching switches in the i detection circuits to be in a turn-on state are both less than the detection resistance in a detection circuit of the single converter in a corresponding case. In some embodiments, a larger quantity i of detection circuits controlled to change a state of the first switching switch indicates a smaller equivalent detection resistance Rd1 between the positive electrode bus BUS+ and the ground cable.

In some embodiments, the equivalent detection resistances Rd2 that are between the negative electrode bus BUS− and the ground cable in the converter system and that exist before and after the control circuit controls the second switching switches in the j detection circuits to be in a turn-on state are also both less than the detection resistance in the detection circuit of the single converter in a corresponding case. For the j detection circuits controlled by the control circuit, a larger quantity j of controlled detection circuits indicates a smaller equivalent detection resistance Rd2 between the negative electrode bus BUS− and the ground cable.

Therefore, in a process of detecting the ground insulation resistance of the converter system, the control circuit may control second switching switches in more detection circuits to be in a turn-on state, that is, control more detection circuits to reduce resistors connected between the negative electrode bus BUS− and the ground cable, so that a value of the equivalent detection resistance Rd2 of the system can be further reduced. The control circuit may also control first switching switches in more detection circuits to be in a turn-on state, that is, control more detection circuits to reduce resistors connected between the positive electrode bus BUS+ and the ground cable, so that a value of the equivalent detection resistance Rd1 of the system can be further reduced. In the two manners, Uc1–Uc2 can be larger, a maximum sampling deviation can be reduced, and detection precision of the ground resistance of the system can be improved.

Based on the foregoing descriptions, detection precision of a ground insulation resistance of a single converter is related to a difference between two disturbance voltages. It is assumed that n=10, RC1=RB1=1800 kΩ, RA1=RD1=1200 kΩ, and UBUS=1200 V. If the method of detecting a ground insulation resistance of a converter system in this embodiment of this application is used, the voltage collected after the control circuit controls the first switching switches in the n detection circuits to be in a turn-on state is Uc9, and the voltage collected after the control circuit controls the second switching switches in the n detection circuits to be in a turn-on state is Uc10, a difference between the two disturbance voltages is Uc9–Uc10. In an actual detection process, the difference Uc9–Uc10 between the two disturbance voltages is also 12.6 V. A sampling circuit with a sampling function of 12 bits may be used in the converter system to ensure that the maximum detection error is 5.8%. It may be learned that the ground insulation resistance of the converter system is far less than the ground insulation resistance of the single converter. In the detection control method provided in this embodiment of this application, detection precision of the ground insulation resistance of the converter system can be implemented. In some embodiments, compared with detection precision existing when the detection circuit of the single converter detects the ground insulation resistance of the system, the detection control method provided in this embodiment of this application improves detection precision of the ground insulation resistance of the system. Detection precision of the ground insulation resistance of the system may be the same as or consistent with detection precision existing when the detection circuit of the single converter detects the ground insulation resistance of the single converter.

It should be understood that a structure or a form of the detection circuit provided in the foregoing embodiment is used to describe a control operation on the detection circuit in the process in which the control circuit detects the insulation resistance of the system, and is not used as a structure or a form of a specific detection circuit of each converter. A structure or a form of each detection circuit may further have more implementations. For example, there is one resistor in each detection circuit, and the resistor is in a plurality of resistors between the positive electrode bus and the ground cable, or in a plurality of resistors between the negative electrode bus and the ground cable.

In some embodiments, the control circuit may include a plurality of controllers. A quantity of controllers may not be less than the quantity of converters in the converter system.

Figure 8:
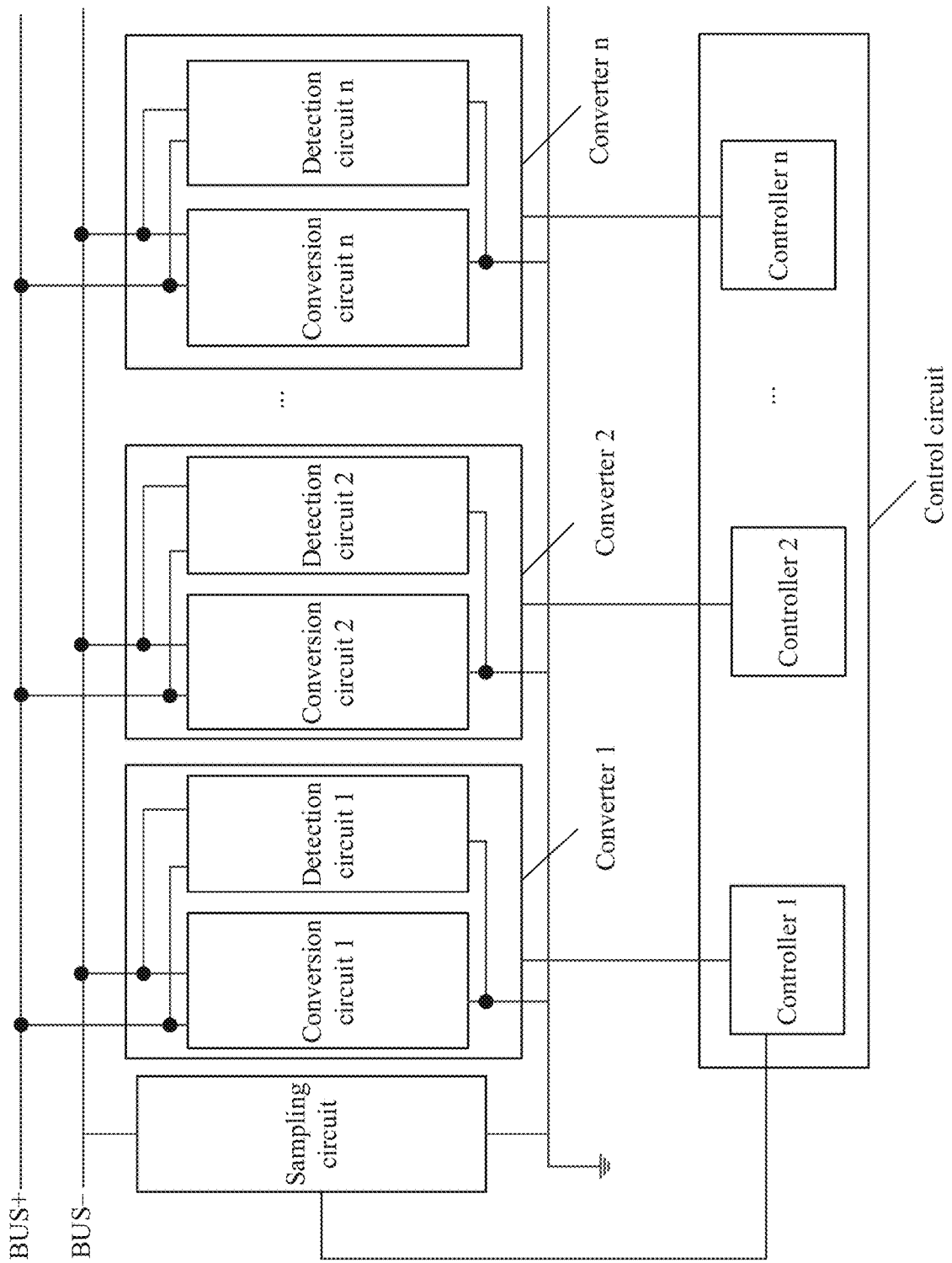
FIG. 8 is a schematic diagram of a structure of a control circuit in a converter system, according to some embodiments.

In an example, the quantity of the plurality of controllers may be equal to the quantity of converters. There is a one-to-one correspondence between the controllers and the converters. For example, as shown in FIG. 8, an $n^{th}$ controller may control an $n^{th}$ converter. For example, the $n^{th}$ controller may control a conversion circuit of the $n^{th}$ converter, or the $n^{th}$ controller may control a switching switch in a detection circuit of the $n^{th}$ converter. Any one of the plurality of controllers may be used as a primary controller, and (n–1) other controllers are used as secondary controllers.

Figure 9:
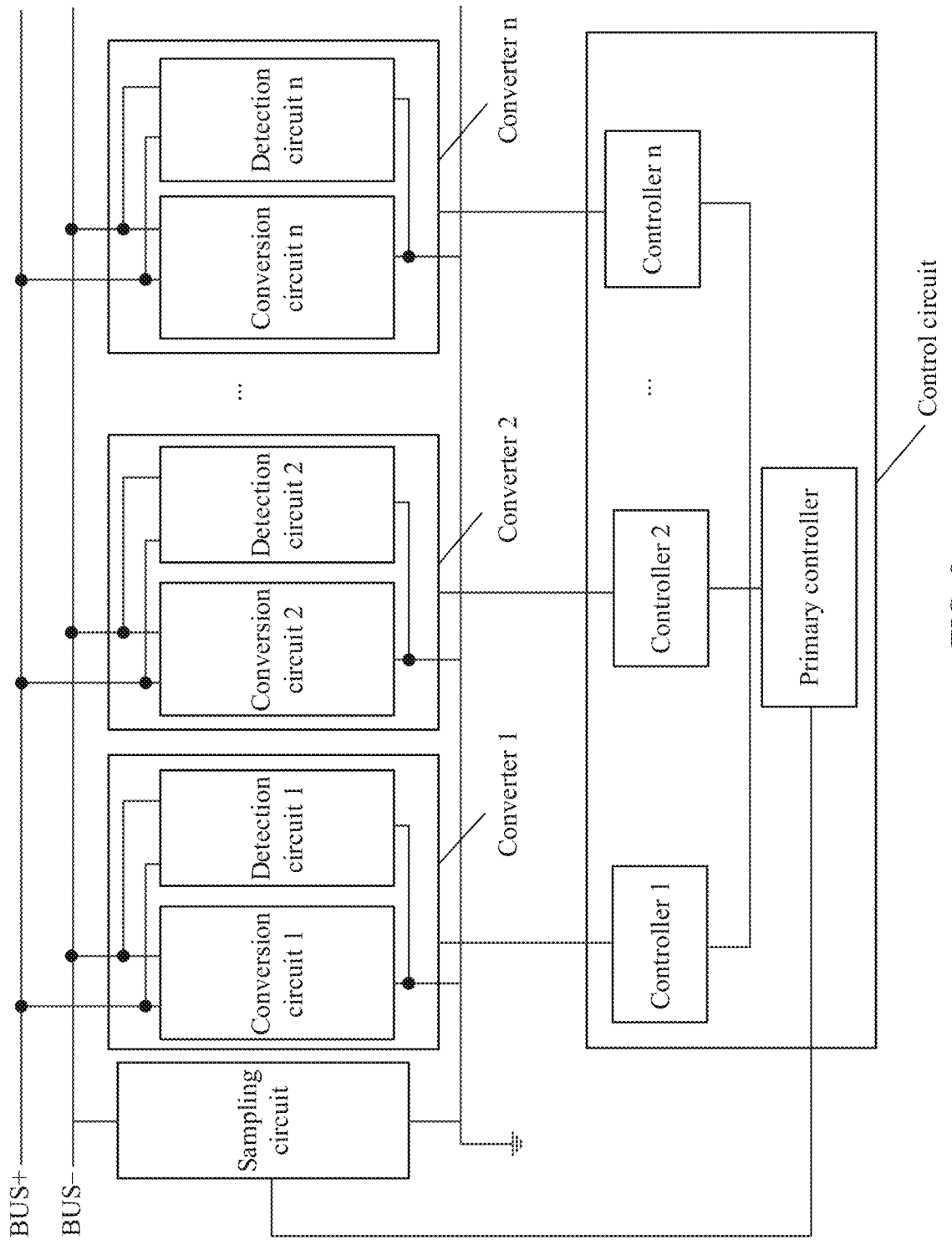
FIG. 9 is a schematic diagram of a structure of a control circuit in another converter system, according to some embodiments.

In another example, the quantity of the plurality of controllers may be greater than the quantity of converters. As shown in FIG. 9, the plurality of controllers may include one primary controller and n secondary controllers. There is a one-to-one correspondence between the n secondary controllers and n converters.

The primary controller may communicate with each secondary controller in a power line carrier communication manner. When the insulation resistance of the converter system is detected, the primary controller may start a detection process.

In some embodiments, the primary controller may directly control the sampling circuit in the converter system to collect a voltage between the negative electrode bus BUS– and the ground cable. The primary controller may send a switching instruction to each secondary controller. After receiving the switching instruction, each secondary controller switches a resistor that is connected between the positive electrode bus and the negative electrode bus and that is in a detection circuit of a converter corresponding to the secondary controller. For example, a converter corresponding to a $k^{th}$ secondary controller is a $k^{th}$ converter. After receiving a switching instruction, the $k^{th}$ secondary controller controls a switching switch in a detection circuit of the $k^{th}$ converter to be in a turn-on state.

In a scenario in which the detection circuit of each converter in the converter system includes a plurality of switches, for example, includes a first switching switch and a second switching switch, the primary controller may send a first switching instruction to the secondary controller. After receiving the first switching instruction, each secondary controller controls a first switching switch in a detection circuit of a converter corresponding to the secondary controller to be in a turn-on state. The primary controller may further send a second switching instruction to the secondary controller. After receiving the second switching instruction, each secondary controller controls a second switching switch in the detection circuit of the converter corresponding to the secondary controller to be in a turn-on state.

Figure 10:
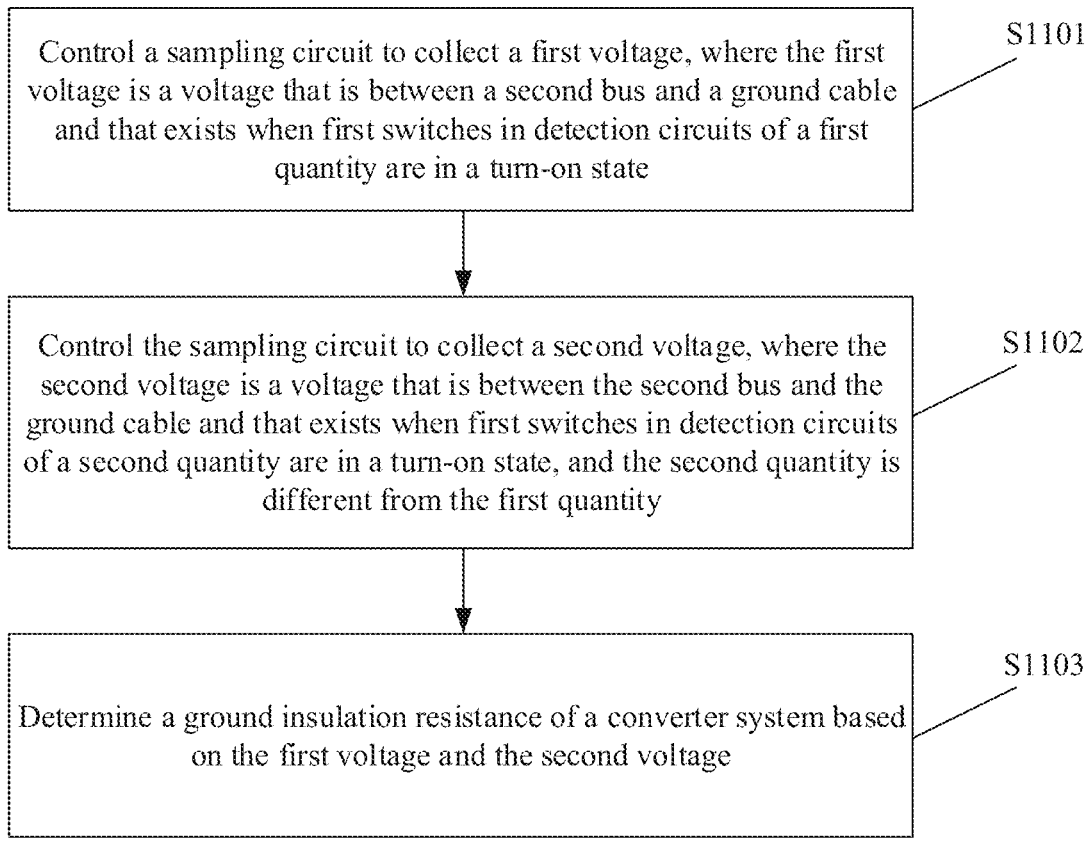
FIG. 10 is a schematic flowchart of a method of detecting an insulation resistance of a system, according to some embodiments.

An embodiment of this application further provides a method of detecting an insulation resistance of a system, and the method may be applied to a converter system. The converter system includes a plurality of converters, a sampling circuit, and a control circuit. Each converter includes a conversion circuit and a detection circuit. Each converter is connected between a first bus and a second bus. The sampling circuit is connected between the second bus and a ground cable. Each detection circuit includes at least one switch and at least two detection resistors connected in series between the second bus and the ground cable. The at least one switch is connected in parallel with a first detection resistor in the at least two detection resistors connected in series between the second bus and the ground cable. As shown in FIG. 10, the method may include the following operations, and the method may be performed by the control circuit.

S1101. The control circuit controls the sampling circuit to collect a first voltage, where the first voltage is a voltage that is between the second bus and the ground cable and that exists when first switches in detection circuits of a first quantity are in a turn-on state.

S1102. The control circuit controls the sampling circuit to collect a second voltage, where the second voltage is a voltage that is between the second bus and the ground cable and that exists when first switches in detection circuits of a second quantity are in a turn-on state, and the second quantity is different from the first quantity.

S1103. The control circuit determines a ground insulation resistance of the converter system based on the first voltage and the second voltage.

In some embodiments, the control circuit may control a switch in the detection circuit to be in a turn-on state or in a turn-off state. After controlling the first switches in the detection circuits of the first quantity to be in a turn-on state, the control circuit may control the sampling circuit to collect the first voltage. After controlling the first switches in the detection circuits of the second quantity to be in a turn-on state, the control circuit may also control the sampling circuit to collect the second voltage.

In some embodiments, the detection circuit includes two resistors connected in series between the second bus and the ground cable, and the first switch is connected in parallel with a first resistor; and the control circuit may determine the ground insulation resistance of the converter system according to the following formula:

$$Riso = \frac{Rz1 \times Rz2}{Rz1 + Rz2}$$

where Riso is the ground insulation resistance of the converter, Rz2 is an insulation resistance between the second bus and the ground cable, Rz1 is an insulation resistance between the first bus and the ground cable, $$Rz2 = \frac{Rd1 \times Rd2 \frac{VB-V2}{VB-V1} \times \frac{V1}{V2} \times Rd1 \times Rd2}{\frac{VB-V2}{VB-V1} \times \frac{V1}{V2} \times Rd2 - Rd1},$$

$$\text{and } Rz1 = \frac{VB-V1}{V1} \times \frac{Rz2Rd1}{Rz2+Rd1};$$

and

Rd1 is an equivalent detection resistance that is between the second bus and the ground cable and that exists when the first switches in the detection circuits of the first quantity are in a turn-on state, Rd2 is an equivalent detection resistance that is between the second bus and the ground cable and that exists when the first switches in the detection circuits of the second quantity are in a turn-on state, $$Rd1 = \frac{RA \times (RA+RB)}{nRA+iRB}, Rd2 = \frac{RA \times (RA+RB)}{nRA+jRB},$$

i is the first quantity, i ∈ [0, n], j is the second quantity, j ∈ [0, n], RB is a resistance value of the first resistor, RA is a resistance value of a second resistor other than the first resistor in the two resistors, n is a quantity of the plurality of converters, VB is a voltage between the first bus and the second bus, V1 is the first voltage, and V2 is the second voltage.

In some embodiments, the detection circuit further includes at least one resistor connected between the first bus and the ground cable.

In some embodiments, the detection circuit further includes a third resistor connected between the first bus and the ground cable; and the control circuit determines the ground insulation resistance of the converter system according to the following formula:

$$Riso = \frac{Rz1 \times Rz2}{Rz1 + Rz2}$$

where Riso is the ground insulation resistance of the converter, Rz2 is an insulation resistance between the second bus and the ground cable, Rz1 is an insulation resistance between the first bus and the ground cable, $$Rz2 = \frac{Rd1 \times Rd2 \frac{VB-V2}{VB-V1} \times \frac{V1}{V2} \times Rd1 \times Rd2}{\frac{VB-V2}{VB-V1} \times \frac{V1}{V2} \times Rd2 - Rd1},$$

$$\text{and } Rz1 = \frac{\frac{VB-V1}{V1} \times \frac{Rz2Rd1}{Rz2+Rd1}}{RC - n \times \frac{VB-V1}{V1} \times \frac{Rz2Rd1}{Rz2+Rd1}};$$

and

Rd1 is an equivalent detection resistance that is between the second bus and the ground cable and that exists when the first switches in the detection circuits of the first quantity are in a turn-on state, Rd2 is an equivalent detection resistance that is between the second bus and the ground cable and that exists when the first switches in the detection circuits of the second quantity are in a turn-on state, $$Rd1 = \frac{RA \times (RA+RB)}{nRA+iRB}, Rd2 = \frac{RA \times (RA+RB)}{nRA+jRB},$$

i is the first quantity, i ∈ [0, n], j is the second quantity, j ∈ [0, n], RB is the first resistor, RA is a second resistor other than the first resistor in the two resistors, RC is the third resistor, n is a quantity of the plurality of converters, VB is a voltage between the first bus and the second bus, V1 is the first voltage, and V2 is the second voltage.

In some embodiments, the detection circuit further includes a second switch and at least two resistors connected in series between the first bus and the ground cable, and the second switch is connected in parallel with one of the at least two resistors connected in series between the first bus and the ground cable. The second switch may be controlled by the control circuit.

In some embodiments, the detection circuit further includes a second switch and two resistors connected in series between the first bus and the ground cable, and the second switch is connected in parallel with a fourth resistor in the two resistors connected in series between the first bus and the ground cable; and if a first switch in each detection circuit is in a turn-on state, a second switch in the detection circuit is in a turn-off state; or if a first switch in each detection circuit is in a turn-off state, a second switch in the detection circuit is in a turn-on state.

In some embodiments, the first quantity is zero, the second quantity is a quantity of the plurality of converters, a resistance value of the fourth resistor is the same as a resistance value of the first resistor, and a resistance value of a fifth resistor other than the fourth circuit in the two resistors connected in series between the first bus and the ground cable is the same as the resistance value of the first resistor. The control circuit may determine the ground insulation resistance of the converter system according to the following formula:

$$Riso = \frac{1}{\frac{\frac{VB}{V1-V2}-1}{\frac{RA}{n}} + \frac{\frac{VB}{V1-V2}+1}{\frac{RA+RB}{n}}}$$

where Riso is the ground insulation resistance of the converter, RB is the first resistor, RA is a second resistor other than the first resistor in the two resistors, n is the quantity of the plurality of converters, VB is a voltage between the first bus and the second bus, V1 is the first voltage, and V2 is the second voltage.

An embodiment of this application further provides a method of detecting an insulation resistance of a system, and the method may be applied to a converter system. The converter system includes a plurality of converters, a sampling circuit, and a control circuit. Each converter includes a conversion circuit and a detection circuit. Each converter is connected between a first bus and a second bus. The sampling circuit is connected between the second bus and a ground cable. Each detection circuit includes at least one switch and at least two detection resistors connected in series between the second bus and the ground cable. The at least one switch is connected in parallel with a first detection resistor in the at least two detection resistors connected in series between the second bus and the ground cable. The plurality of controllers include a primary controller and a plurality of secondary controllers, and the secondary controller is configured to control a switch in a detection circuit of a corresponding converter.

Figure 11:
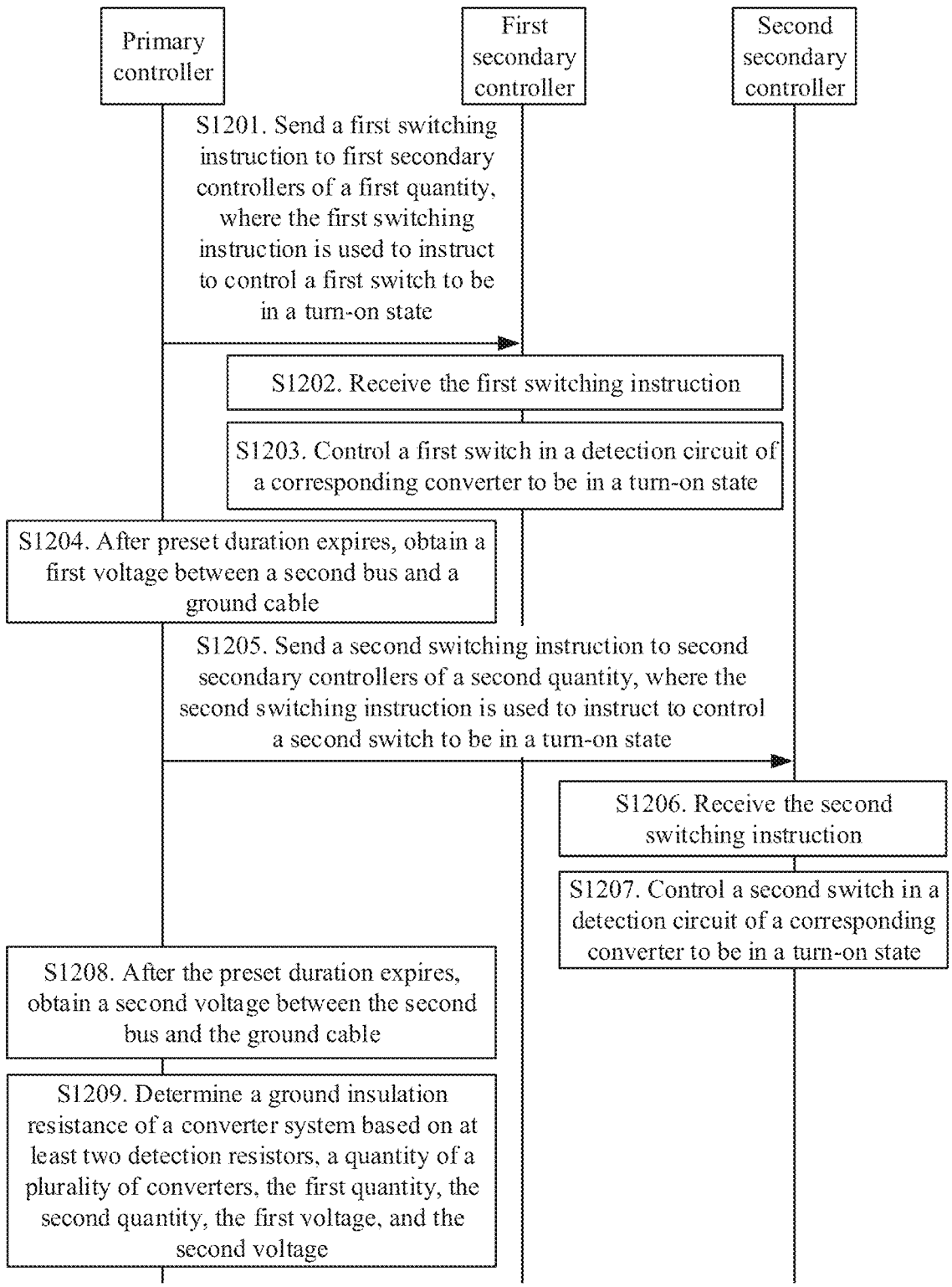
FIG. 11 is a schematic flowchart of another method of detecting an insulation resistance of a system, according to some embodiments.

In an example, the plurality of controllers may be in one-to-one correspondence with the plurality of converters. The primary controller sends an instruction to some secondary controllers each time. As shown in FIG. 11, the method includes the following operations.

S1201. The primary controller sends a first switching instruction to first secondary controllers of a first quantity, where the first switching instruction is used to instruct to control a first switch to be in a turn-on state.

S1202. The first secondary controller receives the first switching instruction.

S1203. The first secondary controller controls a first switch in a detection circuit of a corresponding converter to be in a turn-on state.

The first secondary controller may control, in response to the first switching instruction, the first switch in the detection circuit of the corresponding converter to be in a turn-on state. A second switch in the detection circuit of the converter corresponding to the first secondary controller is in a turn-off state. A switch in a second secondary controller other than the first secondary controller in the plurality of secondary controllers is in a turn-off state.

S1204. After preset duration expires, the primary controller obtains a first voltage between the second bus and the ground cable.

In some embodiments, the primary controller may simultaneously send the first switching instruction to a plurality of first secondary controllers, or may send the first switching instruction to a plurality of first secondary controllers within preset duration. In some embodiments, it may be ensured that when the primary controller obtains the first voltage between the second bus and the ground cable after the preset duration expires, the first switches in the detection circuits of the first quantity, of the converters, in the system are in a turn-on state.

The sampling circuit in the converter system may be integrated into the primary controller, or the primary controller may include a sampling circuit, and the sampling circuit is configured to obtain the voltage between the second bus and the ground cable.

S1205. The primary controller sends a second switching instruction to second secondary controllers of a second quantity, where the second switching instruction is used to instruct to control a second switch to be in a turn-on state.

S1206. The second secondary controller receives the second switching instruction.

S1207. The second secondary controller controls a second switch in a detection circuit of a corresponding converter to be in a turn-on state.

The second secondary controller may control, in response to the second switching instruction, the second switch in the detection circuit of the corresponding converter to be in a turn-on state. A first switch in the detection circuit of the converter corresponding to the second secondary controller is in a turn-off state. The switch in the first secondary controller other than the second secondary controller in the plurality of secondary controllers is in a turn-off state.

S1208. After the preset duration expires, the primary controller obtains a second voltage between the second bus and the ground cable.

In some embodiments, the primary controller may simultaneously send the second switching instruction to a plurality of second secondary controllers, or may send the second switching instruction to a plurality of second secondary controllers within preset duration. In some embodiments, it may be ensured that when the primary controller obtains the second voltage between the second bus and the ground cable after the preset duration expires, the second switches in the detection circuits of the second quantity, of the converters, in the system are in a turn-on state.

S1209. The primary controller determines a ground insulation resistance of the converter system based on the at least two detection resistors, a quantity of the plurality of converters, the first quantity, the second quantity, the first voltage, and the second voltage.

In some embodiments, after determining the ground insulation resistance of the converter system, the primary controller sends a detection end instruction to each secondary controller, so that each secondary controller learns that detection ends.

Figure 12A:
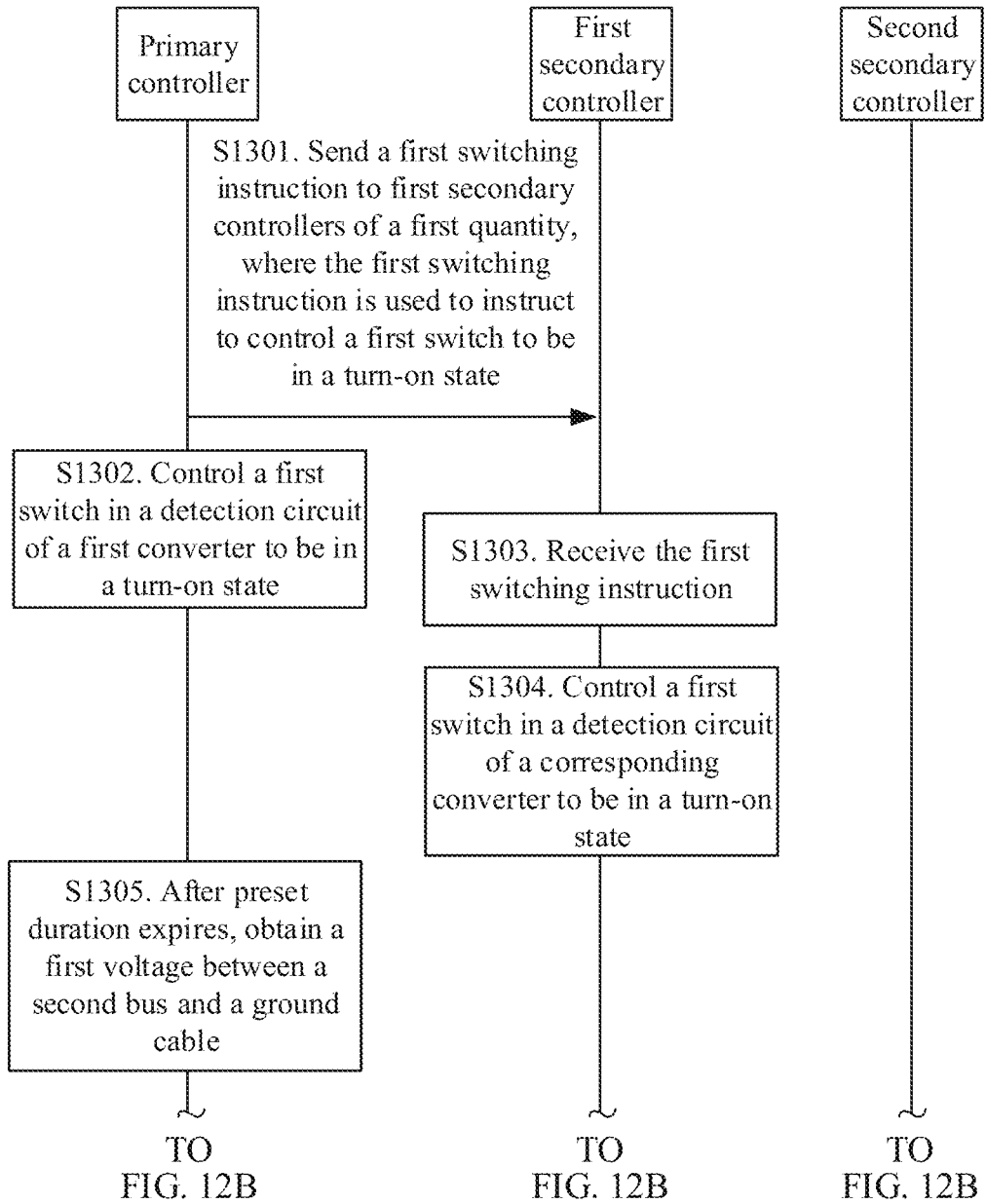
FIG. 12A and FIG. 12B are a schematic flowchart of still another method of detecting an insulation resistance of a system, according to some embodiments.
Figure 12B:
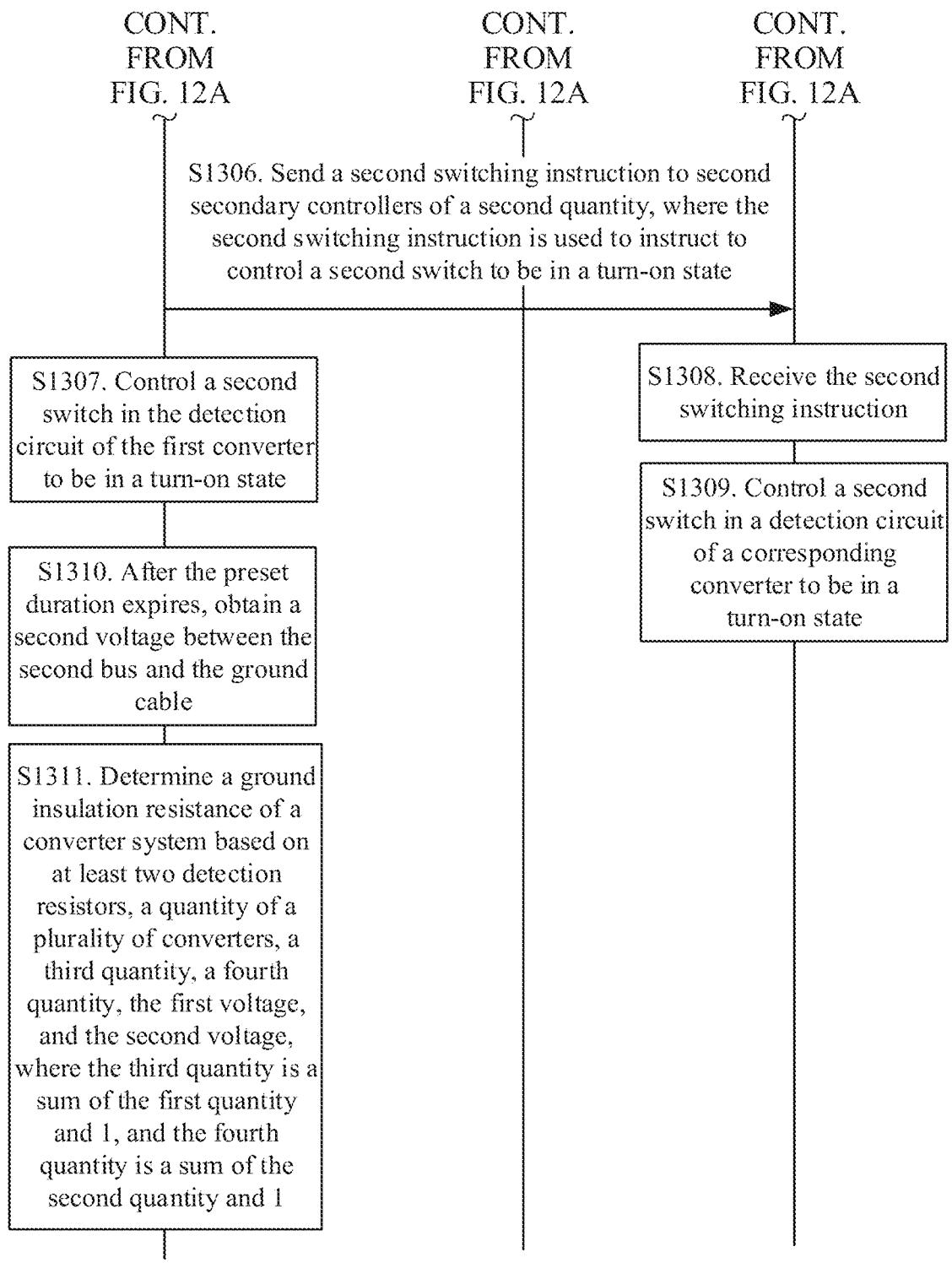

In another example, the primary controller corresponds to a first converter, and the plurality of secondary controllers are in a one-to-one correspondence with second converters other than the first converter in the plurality of converters. As shown in FIG. 12A and FIG. 12B, a process in which the primary controller interacts with the secondary controller is as follows:

S1301. The primary controller sends a first switching instruction to first secondary controllers of a first quantity, where the first switching instruction is used to instruct to control a first switch to be in a turn-on state.

S1302. The primary controller controls a first switch in a detection circuit of the first converter to be in a turn-on state.

S1303. The first secondary controller receives the first switching instruction.

Operation S1302 and operation S1303 may occur synchronously or asynchronously, and a sequence of the two operations is not specifically limited.

S1304. The first secondary controller controls a first switch in a detection circuit of a corresponding converter to be in a turn-on state.

S1305. After preset duration expires, the primary controller obtains a first voltage between the second bus and the ground cable.

S1306. The primary controller sends a second switching instruction to second secondary controllers of a second quantity, where the second switching instruction is used to instruct to control a second switch to be in a turn-on state.

S1307. The primary controller controls a second switch in the detection circuit of the first converter to be in a turn-on state.

S1308. The second secondary controller receives the second switching instruction.

S1309. The second secondary controller controls a second switch in a detection circuit of a corresponding converter to be in a turn-on state.

S1310. After the preset duration expires, the primary controller obtains a second voltage between the second bus and the ground cable.

S1311. The primary controller determines a ground insulation resistance of the converter system based on the at least two detection resistors, a quantity of the plurality of converters, the third quantity, the fourth quantity, the first voltage, and the second voltage, where the third quantity is a sum of the first quantity and 1, and the fourth quantity is a sum of the second quantity and 1.

Figure 13A:
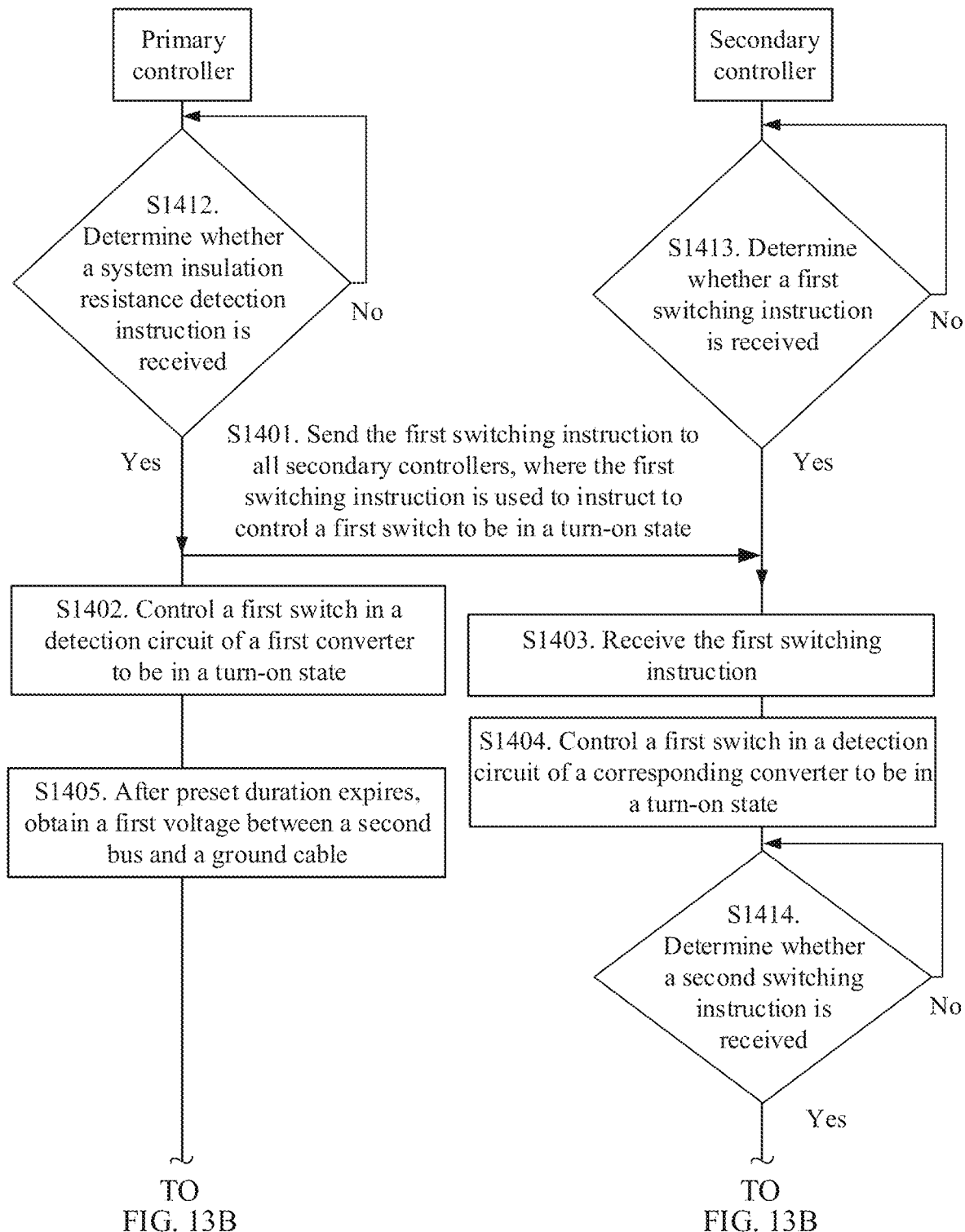
FIG. 13A and FIG. 13B are a schematic flowchart of still another method of detecting an insulation resistance of a system, according to some embodiments.
Figure 13B:
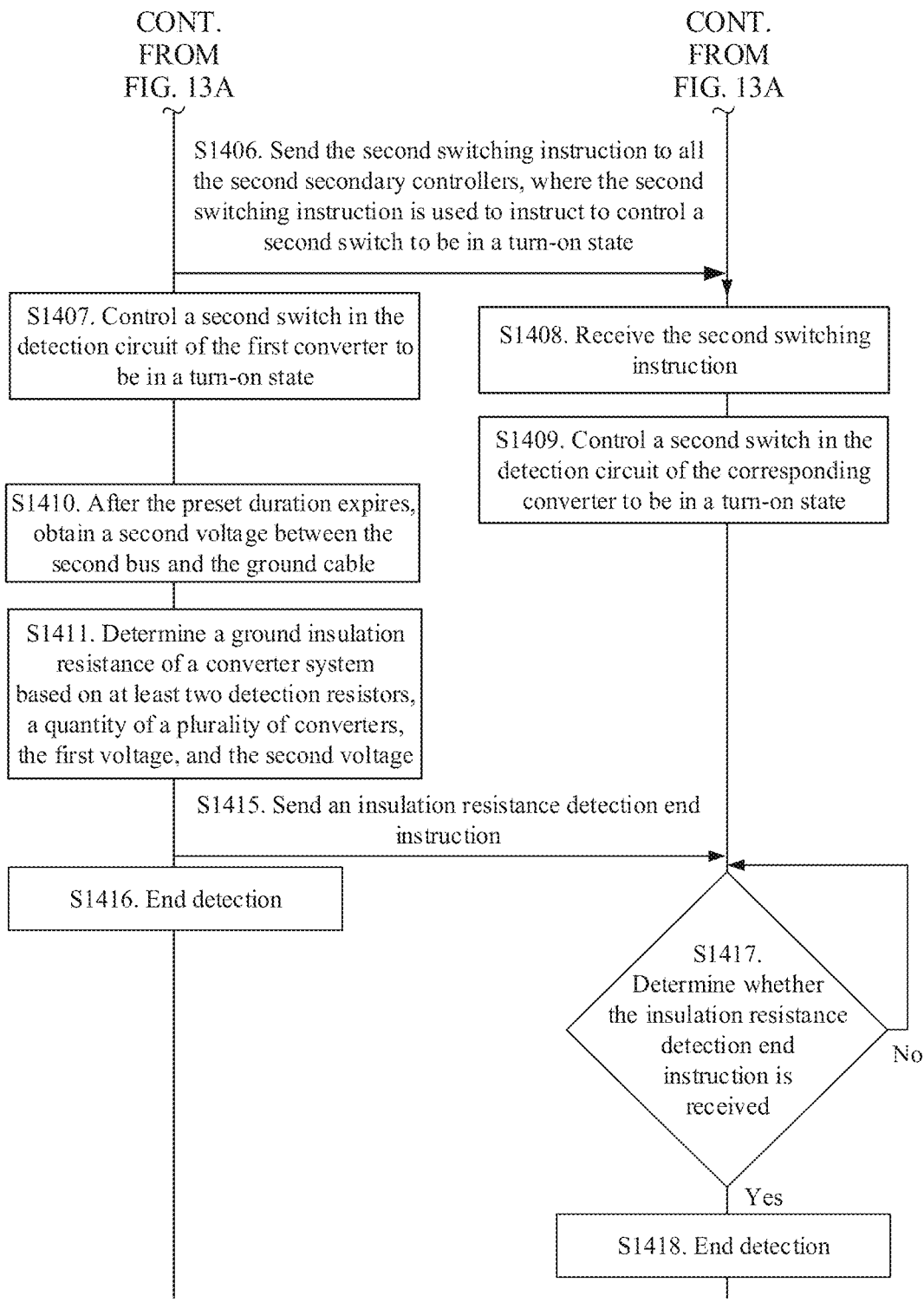

In another example, the primary controller corresponds to a first converter, and the plurality of secondary controllers are in a one-to-one correspondence with second converters other than the first converter in the plurality of converters. The primary controller may send an instruction to all the secondary controllers. As shown in FIG. 13A and FIG. 13B, a process in which the primary controller interacts with the secondary controller is as follows:

S1401. The primary controller sends a first switching instruction to all the secondary controllers, where the first switching instruction is used to instruct to control a first switch to be in a turn-on state.

S1402. The primary controller controls a first switch in a detection circuit of the first converter to be in a turn-on state.

S1403. The secondary controller receives the first switching instruction.

Operation S1402 and operation S1403 may occur synchronously or asynchronously, and a sequence of the two operations is not specifically limited.

S1404. The secondary controller controls a first switch in a detection circuit of a corresponding converter to be in a turn-on state.

S1405. After preset duration expires, the primary controller obtains a first voltage between the second bus and the ground cable.

S1406. The primary controller sends a second switching instruction to all the secondary controllers, where the second switching instruction is used to instruct to control a second switch to be in a turn-on state.

S1407. The primary controller controls a second switch in the detection circuit of the first converter to be in a turn-on state.

S1408. The secondary controller receives the second switching instruction.

S1409. The secondary controller controls a second switch in the detection circuit of the corresponding converter to be in a turn-on state.

S1410. After the preset duration expires, the primary controller obtains a second voltage between the second bus and the ground cable.

S1411. The primary controller determines a ground insulation resistance of the converter system based on the at least two detection resistors, a quantity of the plurality of converters, the first voltage, and the second voltage.

In some embodiments, the primary controller may also start system insulation resistance detection in response to a system insulation resistance detection triggering instruction. For example, the primary controller may perform operation S1412 before operation S1401 to determine whether the system insulation resistance detection instruction is received. If receiving the system insulation resistance detection instruction, the primary controller performs operation S1401 as a next operation to start detection. If receiving no system insulation resistance detection instruction, the primary controller continues to wait to receive the system insulation resistance detection instruction, and determines whether the system insulation resistance detection instruction is received.

Similarly, before operation S1403, the secondary controller may wait for an instruction sent by the primary controller, or may perform operation S1413 to determine whether the first switching instruction is received. If receiving the first switching instruction, the secondary controller may directly perform operation S1404. If receiving no first switching instruction, the secondary controller continues to wait to receive the first switching instruction, and determines whether the first switching instruction is received.

In some embodiments, the secondary controller may perform operation S1414 after performing operation S1404 and before performing operation S1409, to determine whether the second switching instruction is received. If receiving the second switching instruction, the secondary controller may directly perform operation S1409. If receiving no second switching instruction, the secondary controller continues to wait to receive the second switching instruction, and determines whether the second switching instruction is received.

In some embodiments, after performing operation S1411, the primary controller may send an insulation resistance detection end instruction to each secondary controller, for example, perform operation S1415. Then, the primary controller performs operation S1416 to end detection, namely, end the detection process.

After performing operation S1409, the secondary controller may wait for the insulation resistance detection end instruction sent by the primary controller, or may perform operation S1417 to determine whether the insulation resistance detection end instruction is received. If receiving the insulation resistance detection end instruction, the secondary controller may end detection, for example, perform operation S1418. If receiving no insulation resistance detection end instruction, the secondary controller may continue to wait to receive the insulation resistance detection end instruction, and determine whether the insulation resistance detection end instruction is received.

Figure 14:
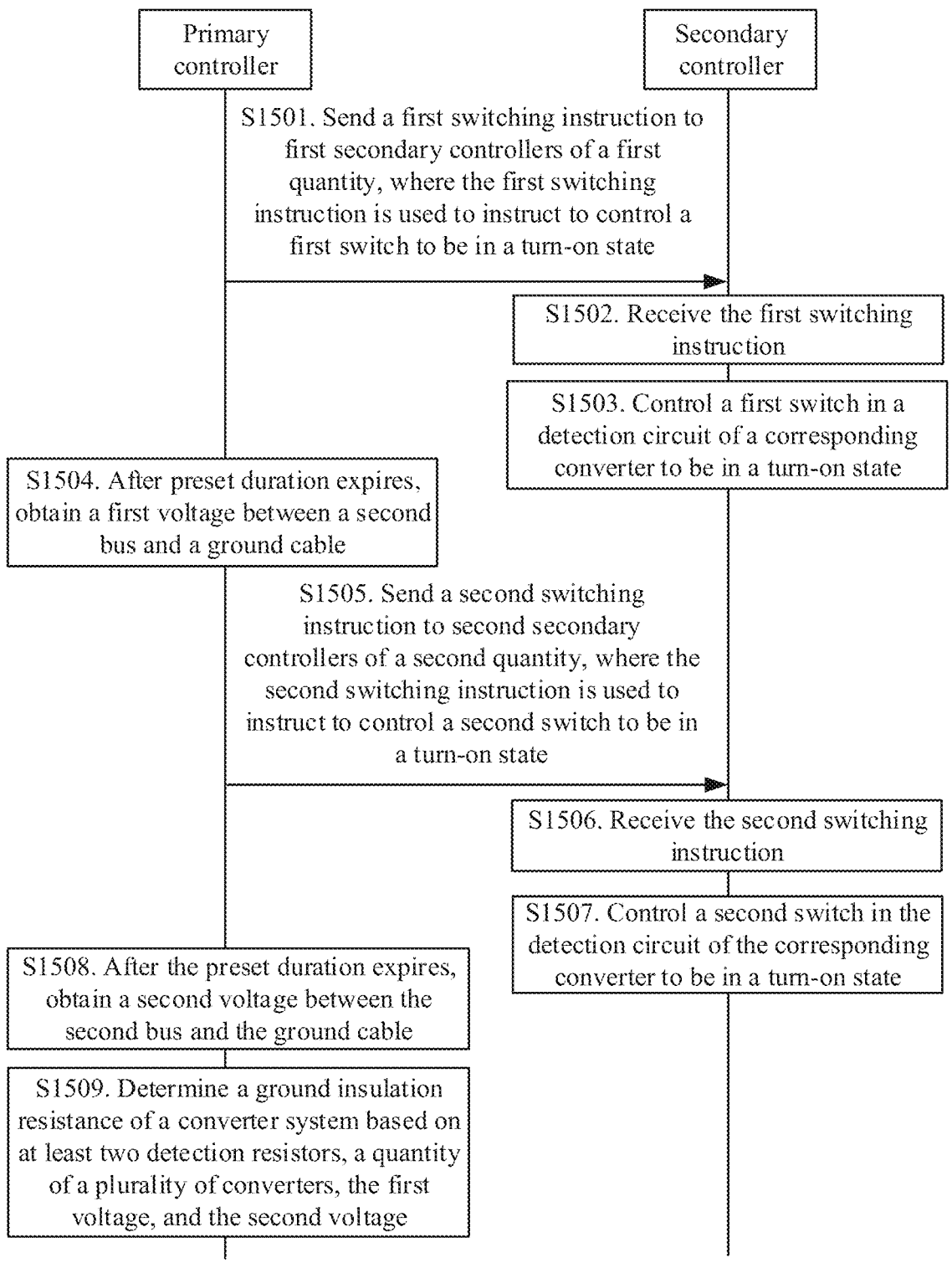
FIG. 14 is a schematic flowchart of still another method of detecting an insulation resistance of a system, according to some embodiments.

In still another example, the plurality of secondary controllers may be in one-to-one correspondence with the plurality of converters. The primary controller sends an instruction to all the secondary controllers each time. As shown in FIG. 14, a process in which the primary controller interacts with the secondary controller is as follows:

S1501. The primary controller sends a first switching instruction to all the secondary controllers, where the first switching instruction is used to instruct to control a first switch to be in a turn-on state.

S1502. The secondary controller receives the first switching instruction.

S1503. The secondary controller controls a first switch in a detection circuit of a corresponding converter to be in a turn-on state.

The secondary controller may control, in response to the first switching instruction, the first switch in the detection circuit of the corresponding converter to be in a turn-on state. A second switch in the detection circuit of the converter corresponding to the secondary controller is in a turn-off state.

S1504. After preset duration expires, the primary controller obtains a first voltage between the second bus and the ground cable.

S1505. The primary controller sends a second switching instruction to the secondary controllers, where the second switching instruction is used to instruct to control a second switch to be in a turn-on state.

S1506. The secondary controller receives the second switching instruction.

S1507. The secondary controller controls a second switch in the detection circuit of the corresponding converter to be in a turn-on state.

The secondary controller may control, in response to the second switching instruction, the second switch in the detection circuit of the corresponding converter to be in a turn-on state. The first switch in the detection circuit of the converter corresponding to the secondary controller is in a turn-off state.

S1508. After the preset duration expires, the primary controller obtains a second voltage between the second bus and the ground cable.

S1509. The primary controller determines a ground insulation resistance of the converter system based on the at least two detection resistors, a quantity of the plurality of converters, the first voltage, and the second voltage.

In some embodiments, after determining the ground insulation resistance of the converter system, the primary controller sends a detection end instruction to all the secondary controllers, so that each secondary controller learns that detection ends.

Figure 15:
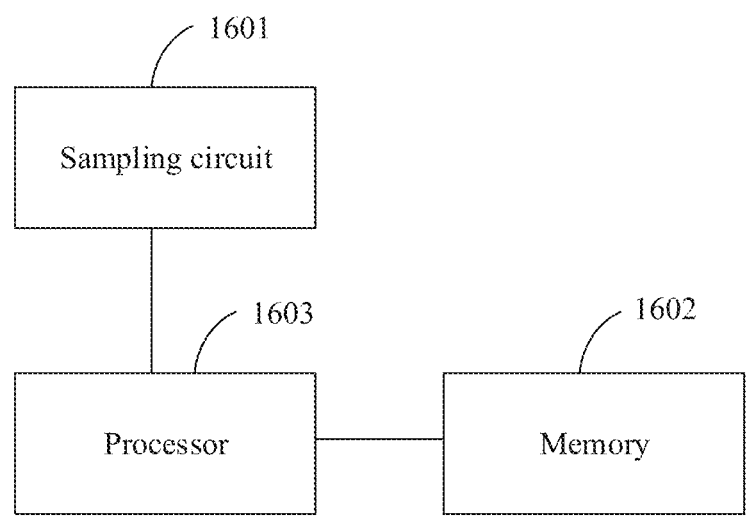
FIG. 15 is a schematic diagram of a structure of an apparatus for detecting an insulation resistance of a system, according to some embodiments.

An embodiment of this application further provides an apparatus for detecting an insulation resistance of a system, and the apparatus is used in a converter system, for example, the converter system provided in the embodiments of this application. The converter system includes a plurality of converters. The plurality of converters are connected in parallel between a first bus and a second bus. Each converter includes a detection circuit. The detection circuit includes a first switch and at least two resistors connected in series between the second bus and a ground cable. The first switch is connected in parallel with one of the at least two resistors connected in series between the second bus and the ground cable. As shown in FIG. 15, the apparatus includes:

- a sampling circuit 1601, configured to obtain a voltage between the second bus and the ground cable;
- a memory 1602, configured to store a program, instructions, or code; and
- a processor 1603, configured to execute the program, the instructions, or the code in the memory to complete any one of the processes of detecting an insulation resistance of a system provided in the embodiments of this application, or perform any one of the methods for detecting an insulation resistance of a system provided in the embodiments of this application.

An embodiment of this application provides an apparatus for detecting an insulation resistance. The apparatus may include a processor and a memory. The memory is configured to store a program, instructions, or code. The processor is configured to execute the program, the instructions, or the code in the memory to complete any one of the processes of detecting an insulation resistance of a system provided in the embodiments of this application, or perform any one of the methods for detecting an insulation resistance of a system provided in the embodiments of this application.

An embodiment of this application provides a non-volatile computer-readable storage medium, configured to store a computer program. The computer program is loaded by a processor to perform any one of the methods for detecting an insulation resistance of a system provided in the embodiments of this application.

Clearly, persons skilled in the art can make various modifications and variations to the embodiments of this application without departing from the spirit and scope of the embodiments of this application. In this way, this application is intended to cover these modifications and variations of the embodiments of this application provided that they fall within the scope of protection defined by the following claims and their equivalent technologies.

What is claimed is:

1. A converter system, comprising:
a plurality of converters connected in parallel between a first bus and a second bus, wherein each converter comprises a detection circuit, the detection circuit comprises a first switch and at least two resistors connected in series between the second bus and a ground cable, the first switch is connected in parallel with one of the at least two resistors;
a sampling circuit connected between the second bus and the ground cable, wherein the sampling circuit is configured to collect a voltage between the second bus and the ground cable; and
a control circuit connected to each of the converters to control the first switch, wherein the control circuit is configured to: control the sampling circuit to collect a first voltage and a second voltage, wherein the first voltage is a voltage that is between the second bus and the ground cable and that is collected by the sampling circuit when first switches in detection circuits of a first quantity are in a turn-on state, the second voltage is a voltage that is between the second bus and the ground cable and that is collected by the sampling circuit when first switches in detection circuits of a second quantity are in a turn-on state, wherein the converter system determines a ground insulation resistance based on the first voltage and the second voltage.

2. The converter system of claim 1, wherein the detection circuit comprises two resistors connected in series between the second bus and the ground cable, and the first switch is connected in parallel with a first resistor in the two resistors; and
the ground insulation resistance that is of the converter system and that is determined by the control circuit based on the first voltage and the second voltage meets the following formula:

$$Riso = \frac{Rz1 \times Rz2}{Rz1 + Rz2}$$

wherein Riso is the ground insulation resistance of the converter, Rz2 is an insulation resistance between the second bus and the ground cable, and Rz1 is an insulation resistance between the first bus and the ground cable;

$$Rz1 = \frac{Rd1 \times Rd2 \frac{VB-V2}{VB-V1} \times \frac{V1}{V2} \times Rd1 \times Rd2}{\frac{VB-V2}{VB-V1} \times \frac{V1}{V2} \times Rd2 - Rd1},$$

$$\text{and } Rz1 = \frac{VB-V1}{V1} \times \frac{Rz2Rd1}{Rz2+Rd1};$$

Rd1 is an equivalent detection resistance that is between the second bus and the ground cable and that exists when the first switches in the detection circuits of the first quantity are in a turn-on state;

Rd2 is an equivalent detection resistance that is between the second bus and the ground cable and that exists when the first switches in the detection circuits of the second quantity are in a turn-on state;

$$Rd1 = \frac{RA \times (RA+RB)}{nRA+iRB}, \quad Rd2 = \frac{RA \times (RA+RB)}{nRA+jRB},$$

i is the first quantity, i ∈ [o,n], j is the second quantity, j ∈ [0,n], i≠j, RB is a resistance value of the first resistor, RA is a resistance value of a second resistor other than the first resistor in the two resistors, and n is a quantity of the plurality of converters; and VB is a voltage between the first bus and the second bus, V1 is the first voltage, and V2 is the second voltage.

3. The converter system of claim 1, wherein the detection circuit further comprises at least one resistor connected between the first bus and the ground cable.

4. The converter system of claim 2, wherein the detection circuit further comprises a third resistor connected between the first bus and the ground cable; and the ground insulation resistance that is of the converter system and that is determined by the control circuit based on the first voltage and the second voltage meets the following formula:

$$Riso = \frac{Rz1 \times Rz2}{Rz1 + Rz2}$$

wherein Riso is the ground insulation resistance of the converter, Rz2 is the insulation resistance between the second bus and the ground cable, and Rz1 is the insulation resistance between the first bus and the ground cable;

$$Rz2 = \frac{Rd1 \times Rd2 - \frac{VB-V2}{VB-V1} \times \frac{V1}{V2} \times Rd1 \times Rd2}{\frac{VB-V2}{VB-V1} \times \frac{V1}{V2} \times Rd2 - Rd1},$$

$$\text{and } Rz1 = \frac{\frac{VB-V1}{V1} \times \frac{Rz2Rd1}{Rz2+Rd1}}{RC - n \times \frac{VB-V1}{V1} \times \frac{Rz2Rd1}{Rz2+Rd1}};$$

Rd1 is the equivalent detection resistance that is between the second bus and the ground cable and that exists when the first switches in the detection circuits of the first quantity are in a turn-on state, and Rd2 is the equivalent detection resistance that is between the second bus and the ground cable and that exists when the first switches in the detection circuits of the second quantity are in a turn-on state;

$$Rd1 = \frac{RA \times (RA+RB)}{nRA+iRB}, \quad Rd2 = \frac{RA \times (RA+RB)}{nRA+jRB},$$

i is the first quantity, i ∈ [0, n], j is the second quantity, j ∈ [0, n], i≠j, RB is the resistance value of the first resistor, RA is the resistance value of the second resistor other than the first resistor in the two resistors, and n is the quantity of the plurality of converters; and RC is a resistance value of the third resistor, VB is the voltage between the first bus and the second bus, V1 is the first voltage, and V2 is the second voltage.

5. The converter system of claim 1, wherein the detection circuit further comprises a second switch and at least two resistors connected in series between the first bus and the ground cable, the second switch is connected in parallel with one of the at least two resistors connected in series between the first bus and the ground cable, and the second switch is controlled by the control circuit.

6. The converter system of claim 1, wherein the detection circuit specifically comprises two resistors connected in series between the second bus and the ground cable, and the first switch is connected in parallel with a first resistor in the two resistors;

the detection circuit further comprises a second switch and two resistors connected in series between the first bus and the ground cable, and the second switch is connected in parallel with a fourth resistor in the two resistors connected in series between the first bus and the ground cable; and if a first switch in each detection circuit is in a turn-on state, a second switch in the detection circuit is in a turn-off state; or if a first switch in each detection circuit is in a turn-off state, a second switch in the detection circuit is in a turn-on state.

7. The converter system of claim 6, wherein the first quantity is zero, the second quantity is a quantity of the plurality of converters, a resistance value of the fourth resistor is the same as a resistance value of the first resistor, and a resistance value of a third resistor other than a fourth resistor in the two resistors connected in series between the first bus and the ground cable is the same as the resistance value of the first resistor; and the ground insulation resistance that is of the converter system and that is determined by the control circuit based on the first voltage and the second voltage meets the following formula:

$$Riso = \frac{1}{\frac{\frac{VB}{V1-V2}-1}{\frac{RA}{n}} + \frac{\frac{VB}{V1-V2}+1}{\frac{RA+RB}{n}}}$$

wherein Riso is the ground insulation resistance of the converter, and RB is the resistance value of the first resistor;

RA is a resistance value of a second resistor other than the first resistor in the two resistors connected in series between the second bus and the ground cable;

n is the quantity of the plurality of converters;

VB is a voltage between the first bus and the second bus; and

V1 is the first voltage, and V2 is the second voltage.

8. The converter system of claim 1, wherein the control circuit comprises a plurality of controllers, and the plurality of controllers are in a one-to-one correspondence with the plurality of converters;
each controller is connected to a corresponding converter, and is configured to control a switch in a detection circuit of the corresponding converter; and
the plurality of controllers comprise a primary controller, the primary controller is configured to send instructions to other controllers that are not the primary controller in the plurality of controllers, and the instructions are to instruct the other controllers to control a respective switch in a detection circuit of a corresponding converter.

9. The converter system of claim 1, wherein the control circuit comprises a plurality of controllers, the plurality of controllers comprise a primary controller and a plurality of secondary controllers, and the plurality of secondary controllers are in a one-to-one correspondence with the plurality of converters;
each secondary controller is connected to a corresponding converter, and is configured to control the corresponding converter; and
the primary controller is configured to send an instruction to each secondary controller, and the instruction is used to instruct the secondary controller to control a switch in a detection circuit of the corresponding converter.

10. A method for detecting a ground insulation resistance of a converter system, the method comprising:
controlling, by a control circuit connected to a plurality of converters of the converter system, a sampling circuit to collect a first voltage, wherein the plurality of converters are connected in parallel between a first bus and a second bus and having respective detections circuits each having a first switch and at least two resistors in series between the second bus and a ground cable, the first switch in parallel with one of the at least two resistors, wherein the sampling circuit is configured to collect a voltage between the second bus and the ground cable, and wherein the first voltage is a voltage that exists when first switches in detection circuits of a first quantity are in a turn-on state;
controlling, by the control circuit, the sampling circuit to collect a second voltage, wherein the second voltage is a voltage that exists when first switches in detection circuits of a second quantity are in a turn-on state; and
determining the ground insulation resistance based on the first voltage and the second voltage.

11. The method of claim 10, wherein the detection circuit specifically comprises two resistors connected in series between the second bus and the ground cable, and the first switch is connected in parallel with a first resistor in the two resistors; and
the ground insulation resistance that is of the converter system and that is determined based on the first voltage and the second voltage meets the following formula:

$$Riso = \frac{Rz1 \times Rz2}{Rz1 + Rz2}$$

wherein Riso is the ground insulation resistance of the converter system, Rz2 is an insulation resistance between the second bus and the ground cable, and Rz1 is an insulation resistance between the first bus and the ground cable;

$$Rz2 = \frac{Rd1 \times Rd2 - \frac{VB-V2}{VB-V1} \times \frac{V1}{V2} \times Rd1 \times Rd2}{\frac{VB-V2}{VB-V1} \times \frac{V1}{V2} \times Rd2 - Rd1},$$

$$\text{and } Rz1 = \frac{VB-V1}{V1} \times \frac{Rz2 Rd1}{Rz2 + Rd1};$$

Rd1 is an equivalent detection resistance that is between the second bus and the ground cable and that exists when the first switches in the detection circuits of the first quantity are in a turn-on state;

Rd2 is an equivalent detection resistance that is between the second bus and the ground cable and that exists when the first switches in the detection circuits of the second quantity are in a turn-on state, $$Rd1 = \frac{RA \times (RA + RB)}{nRA + iRB}, \text{ and } Rd2 = \frac{RA \times (RA + RB)}{nRA + jRB},$$

i is the first quantity, i ∈ [0, n], j is the second quantity, j ∈ [0, n], RB is a resistance value of the first resistor, RA is a resistance value of a second resistor other than the first resistor in the two resistors, and n is a quantity of the plurality of converters; and VB is a voltage between the first bus and the second bus, V1 is the first voltage, and V2 is the second voltage.

12. The method of claim 10, wherein the detection circuit further comprises at least one resistor connected between the first bus and the ground cable.

13. The method of claim 10, wherein the detection circuit further comprises a third resistor connected between the first bus and the ground cable; and
the ground insulation resistance that is of the converter system and that is determined based on the first voltage and the second voltage meets the following formula:

$$Riso = \frac{Rz1 \times Rz2}{Rz1 + Rz2}$$

wherein Riso is the ground insulation resistance of the converter system, Rz2 is an insulation resistance between the second bus and the ground cable, and Rz1 is an insulation resistance between the first bus and the ground cable;

$$Rz2 = \frac{Rd1 \times Rd2 - \frac{VB-V2}{VB-V1} \times \frac{V1}{V2} \times Rd1 \times Rd2}{\frac{VB-V2}{VB-V1} \times \frac{V1}{V2} \times Rd2 - Rd1},$$

$$\text{and } Rz1 = \frac{\frac{VB-V1}{V1} \times \frac{Rz2 Rd1}{Rz2 + Rd1}}{RC - n \times \frac{VB-V1}{V1} \times \frac{Rz2 Rd1}{Rz2 + Rd1}},$$

Rd1 is an equivalent detection resistance that is between the second bus and the ground cable and that exists when the first switches in the detection circuits of the first quantity are in a turn-on state, and Rd2 is an equivalent detection resistance that is between the second bus and the ground cable and that exists when the first switches in the detection circuits of the second quantity are in a turn-on state;

$$Rd1 = \frac{RA \times (RA + RB)}{nRA + iRB}, Rd2 = \frac{RA \times (RA + RB)}{nRA + jRB},$$

i is the first quantity, $i \in [0, n]$, j is the second quantity, $j \in [0, n]$, RB is a resistance value of a first resistor, RA is a resistance value of a second resistor other than the first resistor in the two resistors, and n is a quantity of the plurality of converters; and RC is a resistance value of the third resistor, VB is a voltage between the first bus and the second bus, V1 is the first voltage, and V2 is the second voltage.

14. The method of claim 10, wherein the detection circuit further comprises a second switch and at least two resistors connected in series between the first bus and the ground cable, and the second switch is connected in parallel with one of the at least two resistors connected in series between the first bus and the ground cable.

15. The method of claim 10, wherein the detection circuit specifically comprises two resistors connected in series between the second bus and the ground cable, and the first switch is connected in parallel with a first resistor in the two resistors;

the detection circuit further comprises a second switch and two resistors connected in series between the first bus and the ground cable, and the second switch is connected in parallel with a fourth resistor in the two resistors connected in series between the first bus and the ground cable; and if a first switch in each detection circuit is in a turn-on state, a second switch in the detection circuit is in a turn-off state; or if a first switch in each detection circuit is in a turn-off state, a second switch in the detection circuit is in a turn-on state.

16. The method of claim 15, wherein the first quantity is zero, the second quantity is a quantity of the plurality of converters, a resistance value of the fourth resistor is the same as a resistance value of the first resistor, and a resistance value of a fifth resistor other than a fourth circuit in the two resistors connected in series between the first bus and the ground cable is the same as the resistance value of the first resistor; and the ground insulation resistance that is of the converter system and that is determined based on the first voltage and the second voltage meets the following formula:

$$Riso = \frac{1}{\frac{\frac{VB}{V1-V2}-1}{\frac{RA}{n}} + \frac{\frac{VB}{V1-V2}+1}{\frac{RA+RB}{n}}}$$

wherein Riso is the ground insulation resistance of the converter system, RB is the resistance value of the first resistor, and RA is a resistance value of a second resistor other than the first resistor in the two resistors connected in series between the second bus and the ground cable;

n is the quantity of the plurality of converters;

VB is a voltage between the first bus and the second bus; and

V1 is the first voltage, and V2 is the second voltage.

17. An apparatus for detecting an insulation resistance of a system, used in a converter system, wherein the converter system comprises a plurality of converters, the plurality of converters are connected in parallel between a first bus and a second bus, each converter comprises a detection circuit, the detection circuit comprises a first switch and at least two resistors connected in series between the second bus and a ground cable, and the first switch is connected in parallel with one of the at least two resistors connected in series between the second bus and the ground cable; and the apparatus comprises:

a sampling circuit, configured to collect a voltage between the second bus and the ground cable;

a memory, configured to store a program, instructions, or code; and a processor, configured to execute the program, the instructions, or the code in the memory to:

control the sampling circuit to collect a first voltage, wherein the first voltage is a voltage that is between the second bus and the ground cable and that exists when first switches in detection circuits of a first quantity are in a turn-on state;

control the sampling circuit to collect a second voltage, wherein the second voltage is a voltage that is between the second bus and the ground cable and that exists when first switches in detection circuits of a second quantity are in a turn-on state; and determine the insulation resistance based on the first voltage and the second voltage.

18. A non-volatile computer-readable storage medium, configured to store a computer program, wherein the computer program is loaded by a processor to perform the method of claim 10.

19. The converter system of claim 1, wherein the second quantity is different from the first quantity, and the control circuit is further configured to determine a ground insulation resistance of the converter system based on the first voltage and the second voltage.

20. The method of claim 10, wherein the second quantity is different from the first quantity, and further comprising:

determining a ground insulation resistance of the converter system based on the first voltage and the second voltage.

* * * * *

UNITED STATES PATENT AND TRADEMARK OFFICE
CERTIFICATE OF CORRECTION

| | | |
|---|---|---|
| PATENT NO. | : 11,977,110 B2 | Page 1 of 1 |
| APPLICATION NO. | : 17/667297 | |
| DATED | : May 7, 2024 | |
| INVENTOR(S) | : Haibin Guo et al. | |

It is certified that error appears in the above-identified patent and that said Letters Patent is hereby corrected as shown below:

In the Claims

In Claim 2, Column 43, Lines 1-8, delete:

" $$Rz1 = \frac{Rd1 \times Rd2 - \frac{VB-V2}{VB-V1} \times \frac{V1}{V2} \times Rd1 \times Rd2}{\frac{VB-V2}{VB-V1} \times \frac{V1}{V2} \times Rd2 - Rd1}, \text{ and } Rz1 = \frac{VB-V1}{V1} \times \frac{Rz2Rd1}{Rz2+Rd1},$$ "

And insert:

-- $$Rz2 = \frac{Rd1 \times Rd2 - \frac{VB-V2}{VB-V1} \times \frac{V1}{V2} \times Rd1 \times Rd2}{\frac{VB-V2}{VB-V1} \times \frac{V1}{V2} \times Rd2 - Rd1}, \text{ and } Rz1 = \frac{VB-V1}{V1} \times \frac{Rz2Rd1}{Rz2+Rd1},$$ --.

Signed and Sealed this
Thirteenth Day of August, 2024

Katherine Kelly Vidal
*Director of the United States Patent and Trademark Office*